US009023580B2

(12) United States Patent
Shiono et al.

(10) Patent No.: US 9,023,580 B2
(45) Date of Patent: May 5, 2015

(54) METHOD OF FORMING POLYMERIC COMPOUND, RESIST COMPOSITION AND METHOD OF FORMING RESIST PATTERN

(71) Applicant: Tokyo Ohka Kogyo Co., Ltd., Kawasaki (JP)

(72) Inventors: Daiju Shiono, Kawasaki (JP); Tomoyuki Hirano, Kawasaki (JP); Takahiro Dazai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/683,263

(22) Filed: Nov. 21, 2012

(65) Prior Publication Data

US 2013/0137049 A1      May 30, 2013

(30) Foreign Application Priority Data

Nov. 24, 2011    (JP) ................. 2011-256383

(51) Int. Cl.
| | | |
|---|---|---|
| G03F 7/039 | (2006.01) | |
| C08F 2/38 | (2006.01) | |
| G03F 7/004 | (2006.01) | |
| C08F 28/06 | (2006.01) | |
| G03F 7/11 | (2006.01) | |
| G03F 7/20 | (2006.01) | |

(52) U.S. Cl.
CPC ............... *G03F 7/004* (2013.01); *C08F 28/06* (2013.01); *G03F 7/0397* (2013.01); *G03F 7/11* (2013.01); *G03F 7/2041* (2013.01)

(58) Field of Classification Search
CPC ....... G03F 7/004; G03F 7/039; G03F 7/0392; C08F 28/00; C08F 28/06; C08F 4/6495
USPC ............... 430/270.1, 326, 910; 526/83, 111, 526/124.8, 217, 287, 303.1, 321
See application file for complete search history.

(56) References Cited

U.S. PATENT DOCUMENTS

| | | | |
|---|---|---|---|
| 4,458,001 A | 7/1984 | Taylor | |
| 5,945,517 A | 8/1999 | Nitta et al. | |
| 6,153,733 A | 11/2000 | Yukawa et al. | |
| 6,388,101 B1 | 5/2002 | Hada et al. | |
| 6,623,907 B2 | 9/2003 | Numata et al. | |
| 6,753,125 B2 | 6/2004 | Choi et al. | |
| 6,855,840 B2* | 2/2005 | McCormick et al. | 558/230 |
| 7,078,562 B2 | 7/2006 | Furukawa et al. | |
| 7,186,495 B2 | 3/2007 | Maeda et al. | |
| 7,273,690 B2 | 9/2007 | Kodama et al. | |
| 7,459,261 B2 | 12/2008 | Hatakeyama et al. | |
| 8,105,749 B2* | 1/2012 | Dazai et al. | 430/270.1 |
| 8,182,976 B2* | 5/2012 | Dazai et al. | 430/270.1 |
| 8,192,915 B2* | 6/2012 | Dazai et al. | 430/270.1 |
| 8,206,891 B2 | 6/2012 | Seshimo et al. | |
| 8,227,170 B2* | 7/2012 | Dazai et al. | 430/270.1 |
| 8,232,041 B2* | 7/2012 | Dazai et al. | 430/270.1 |
| 8,236,477 B2* | 8/2012 | Matsumiya et al. | 430/270.1 |
| 8,257,904 B2 | 9/2012 | Motoike et al. | |
| 8,283,105 B2 | 10/2012 | Kakinoya et al. | |
| 8,323,869 B2 | 12/2012 | Shimizu et al. | |
| 8,329,378 B2* | 12/2012 | Hirano et al. | 430/270.1 |
| 8,349,534 B2 | 1/2013 | Kurosawa et al. | |
| 8,394,578 B2* | 3/2013 | Hirano et al. | 430/322 |
| 2003/0031950 A1 | 2/2003 | Uenishi et al. | |
| 2003/0203309 A1 | 10/2003 | Nishimura et al. | |
| 2004/0009429 A1 | 1/2004 | Sato | |
| 2004/0110085 A1 | 6/2004 | Iwai et al. | |
| 2004/0157155 A1 | 8/2004 | Harada et al. | |
| 2005/0089800 A1 | 4/2005 | Lee | |
| 2005/0153233 A1 | 7/2005 | Wu et al. | |
| 2005/0192414 A1* | 9/2005 | Donck et al. | 526/64 |
| 2005/0266351 A1 | 12/2005 | Takemoto et al. | |
| 2006/0110677 A1 | 5/2006 | Houlihan et al. | |
| 2006/0166131 A1 | 7/2006 | Masuda et al. | |
| 2006/0199100 A1 | 9/2006 | Kanda | |
| 2006/0263719 A1 | 11/2006 | Endo et al. | |
| 2007/0032614 A1* | 2/2007 | Goossens et al. | 526/65 |
| 2007/0149702 A1 | 6/2007 | Ando et al. | |
| 2007/0231708 A1 | 10/2007 | Matsumaru et al. | |
| 2008/0026331 A1 | 1/2008 | Hasegawa et al. | |

(Continued)

FOREIGN PATENT DOCUMENTS

| | | |
|---|---|---|
| EP | 1331216 | 7/2003 |
| JP | A-06-194847 | 7/1994 |

(Continued)

OTHER PUBLICATIONS

Machine translation of JP 2011-184390 published on Sep. 22, 2011.*
Borodovsky, "Marching to the beat of Moore's Law," *Proc. of SPIE*, vol. 6153, pp. 615301-1-615301-19, (2006).
Ebihara et al., "Beyond $k_1$=0.25 lithography: 70nm L/S patterning using KrF scanners," *Proc. of SPIE*, vol. 5256, pp. 985-994, (2003).
Gil et al., "First Microprocessors with Immersion Lithography," *Proc. of SPIE*, vol. 5754, pp. 119-128, (2005).
Irie et al., "Surface Property Control for 193nm Immersion Resist," *Journal of Photopolymer Science and Technology*, 19(4):565-568, (2006).
Notice of Allowance issued Mar. 29, 2011 in Korean Application No. 10-2009-0076759.
Office Action mailed Sep. 12, 2011 in U.S. Appl. No. 12/461,688.
Notice of Allowance mailed Jan. 25, 2012 in U.S. Appl. No. 12/461,688.
Notice of Allowance issued Sep. 11, 2012 in Taiwanese Application No. 098128212.
Office Action mailed Sep. 10, 2013 in Japanese Application No. 2009-185959.
Office Action mailed Sep. 12, 2011 in U.S. Appl. No. 12/461,687.
Notice of Allowance mailed Jan. 25, 2012 in U.S. Appl. No. 12/461,687.

(Continued)

*Primary Examiner* — Anca Eoff
(74) *Attorney, Agent, or Firm* — Knobbe Martens Olson & Bear LLP

(57) ABSTRACT

A method of producing a polymeric compound, including: copolymerizing a monomer containing an —$SO_2$— containing cyclic group with a monomer containing an acid decomposable group which exhibits increased polarity by the action of acid, thereby obtaining the polymeric compound, provided that the polymeric compound comprises no structural unit derived from a monomer that generates acid upon exposure, wherein the copolymerizing is conducted in the presence of 0.001 to 1.0 mol % of a basic compound, based on the monomer containing an —$SO_2$— containing cyclic group.

3 Claims, No Drawings

(56) References Cited

U.S. PATENT DOCUMENTS

| | | |
|---|---|---|
| 2008/0096128 A1 | 4/2008 | Takeda et al. |
| 2008/0102407 A1 | 5/2008 | Ohsawa et al. |
| 2008/0187860 A1 | 8/2008 | Tsubaki et al. |
| 2008/0199806 A1 | 8/2008 | Hatakeyama et al. |
| 2009/0035700 A1 | 2/2009 | Nakayama et al. |
| 2009/0042129 A1 | 2/2009 | Takeshita |
| 2009/0042147 A1 | 2/2009 | Tsubaki |
| 2009/0061358 A1 | 3/2009 | Ohashi et al. |
| 2009/0068590 A1 | 3/2009 | Dazai et al. |
| 2009/0130597 A1 | 5/2009 | Seshimo et al. |
| 2009/0214982 A1 | 8/2009 | Shimizu et al. |
| 2009/0226842 A1 | 9/2009 | Shimizu et al. |
| 2009/0233220 A1 | 9/2009 | Muroi et al. |
| 2009/0233223 A1 | 9/2009 | Tachibana et al. |
| 2009/0239179 A1 | 9/2009 | Kinsho et al. |
| 2009/0317743 A1 | 12/2009 | Shiono et al. |
| 2009/0317745 A1 | 12/2009 | Mimura et al. |
| 2010/0075249 A1 | 3/2010 | Utsumi et al. |
| 2010/0086873 A1 | 4/2010 | Seshimo et al. |
| 2010/0136478 A1 | 6/2010 | Kawaue et al. |
| 2010/0136480 A1 | 6/2010 | Motoike et al. |
| 2010/0196821 A1 | 8/2010 | Dazai et al. |
| 2010/0233623 A1 | 9/2010 | Kurosawa et al. |
| 2010/0233624 A1 | 9/2010 | Kakinoya et al. |
| 2010/0233626 A1 | 9/2010 | Shimizu et al. |
| 2010/0266966 A1* | 10/2010 | Park et al. .............. 430/323 |
| 2010/0323296 A1 | 12/2010 | Ichikawa et al. |
| 2011/0009661 A1 | 1/2011 | Tanaka et al. |
| 2011/0015431 A1 | 1/2011 | Jodry et al. |
| 2011/0034721 A1 | 2/2011 | Hagiwara et al. |
| 2011/0117497 A1 | 5/2011 | Sato et al. |
| 2011/0236824 A1* | 9/2011 | Hirano et al. .......... 430/270.1 |
| 2011/0244392 A1 | 10/2011 | Hirano et al. |
| 2011/0311913 A1 | 12/2011 | Suzuki et al. |

FOREIGN PATENT DOCUMENTS

| | | |
|---|---|---|
| JP | A-09-208554 | 8/1997 |
| JP | A-10-207069 | 8/1998 |
| JP | A-10-221852 | 8/1998 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-026446 | 1/2000 |
| JP | A-2000-137327 | 5/2000 |
| JP | A-2002-088124 | 3/2002 |
| JP | A-2002-090991 | 3/2002 |
| JP | A-2002-107933 | 4/2002 |
| JP | A-2003-241385 | 8/2003 |
| JP | A-2003-337419 | 11/2003 |
| JP | A-2004-051995 | 2/2004 |
| JP | A-2004-244439 | 9/2004 |
| JP | A-2004-331981 | 11/2004 |
| JP | A-2005-113118 | 4/2005 |
| JP | A-2005-331918 | 12/2005 |
| JP | A-2005-336452 | 12/2005 |
| JP | A-2006-016379 | 1/2006 |
| JP | A-2006-045311 | 2/2006 |
| JP | A-2006-171568 | 6/2006 |
| JP | A-2006-215526 | 8/2006 |
| JP | A-2006-259582 | 9/2006 |
| JP | A-2006-276458 | 10/2006 |
| JP | A-2006-276851 | 10/2006 |
| JP | A-2006-323111 | 11/2006 |
| JP | A-2006-328241 | 12/2006 |
| JP | A-2006-349800 | 12/2006 |
| JP | A-2007-031355 | 2/2007 |
| JP | A-2007-093910 | 4/2007 |
| JP | A-2007-119696 | 5/2007 |
| JP | A-2007-146142 | 6/2007 |
| JP | A-2007-517967 | 7/2007 |
| JP | A-2008-031298 | 2/2008 |
| JP | A-2008-083158 | 4/2008 |
| JP | A-2008-083159 | 4/2008 |
| JP | A-2008-133312 | 6/2008 |
| JP | A-2008-521039 | 6/2008 |
| JP | 2008-158157 | 7/2008 |
| JP | A-2008-292975 | 12/2008 |
| JP | A-2009-025707 | 2/2009 |
| JP | A-2009-025723 | 2/2009 |
| JP | A-2009-062491 | 3/2009 |
| JP | A-2009-080474 | 4/2009 |
| JP | A-2009-091350 | 4/2009 |
| JP | A-2009-091351 | 4/2009 |
| JP | A-2009-098509 | 5/2009 |
| JP | A-2009-221394 | 10/2009 |
| JP | A-2009-223300 | 10/2009 |
| JP | A-2009-244859 | 10/2009 |
| JP | A-2009-288504 | 12/2009 |
| JP | A-2010-002870 | 1/2010 |
| JP | A-2010-026478 | 2/2010 |
| JP | A-2010-262258 | 11/2010 |
| JP | 2011-184390 | * 9/2011 |
| KR | 10-2002-0077275 | 10/2002 |
| KR | 10-2007-0069068 | 7/2007 |
| TW | 200506528 A | 2/2005 |
| TW | 2006-06580 | 2/2006 |
| TW | 2006-28979 | 8/2006 |
| TW | 2006-32558 | 9/2006 |
| TW | 2007-07108 | 2/2007 |
| TW | 200705105 | 2/2007 |
| TW | 200837496 A | 9/2008 |
| TW | 200841128 | 10/2008 |
| WO | WO 02/23273 | 3/2002 |
| WO | WO 2004/074242 A2 | 9/2004 |
| WO | WO 2007/094473 | 8/2007 |
| WO | WO 2009/104753 | 8/2009 |
| WO | WO 2010/001913 | 1/2010 |

OTHER PUBLICATIONS

Office Action mailed Jan. 28, 2013 in U.S. Appl. No. 13/454,399.
Office Action mailed Nov. 15, 2013 in Taiwanese Application No. 098128053.
Notice of Allowance issued Jul. 9, 2013 in Japanese Application No. 2009-130554.
Office Action mailed Jun. 21, 2012 in U.S. Appl. No. 13/028,594.
Office Action mailed Mar. 4, 2014 in Japanese Application No. 2010-146284.
Office Action mailed Jan. 19, 2012 in U.S. Appl. No. 12/685,579.
Notice of Allowance issued Feb. 26, 2013 in Japanese Application No. 2009-006006.
Notice of Allowance mailed May 6, 2010 in U.S. Appl. No. 12/204,460.
Office Action mailed Apr. 24, 2012 in Japanese Application No. 2007-233247.
Office Action mailed Mar. 15, 2012 in U.S. Appl. No. 12/721,240.
Notice of Allowance issued on Mar. 12, 2013 in Japanese Application No. 2009-056809.
Office Action mailed Apr. 16, 2014 in Taiwanese Application No. 099106160.
Office Action mailed Feb. 3, 2012 in U.S. Appl. No. 12/694,037.
Office Action mailed Mar. 12, 2013 in Japanese Application No. 2009-033273.
Office Action mailed Apr. 16, 2014 in Taiwanese Application No. 099103986.
Office Action mailed Aug. 3, 2012 in U.S. Appl. No. 12/979,067.
Office Action mailed Mar. 4, 2013 in U.S. Appl. No. 12/979,067.
Final Office Action mailed Sep. 26, 2013 in U.S. Appl. No. 12/979,067.
Notice of Allowance issued Jan. 7, 2014 in Japanese Application No. 2010-000662.
Office Action mailed May 16, 2014 in Taiwanese Application No. 098140993.
Notice of Allowance in Taiwanese Patent Application No. 098145880, mailed Nov. 14, 2014.

* cited by examiner

METHOD OF FORMING POLYMERIC COMPOUND, RESIST COMPOSITION AND METHOD OF FORMING RESIST PATTERN

TECHNICAL FIELD

The present invention relates to a method of producing a polymeric compound useful as a base component for a resist composition, a resist composition including the polymeric compound, and a method of forming a resist pattern using the resist composition.

Priority is claimed on Japanese Patent Application No. 2011-256383, filed on Nov. 24, 2011, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

Conventionally, as a resist material that satisfies these conditions, a chemically amplified composition is used, which includes an acid-generator component that generates acid upon exposure and a base material component that exhibits a changed solubility in a developing solution under the action of acid.

As the base component used in a chemically amplified resist composition, a resin (base resin) is generally used.

For example, in the case of forming a positive-tone resist pattern by an alkali developing process using an alkali developing solution as the developing solution, a chemically amplified resist which contains an acid generator and a resin composition that exhibits increased solubility in an alkali developing solution by the action of acid is generally used. If the resist film formed using the resist composition is selectively exposed during formation of a resist pattern, then within the exposed portions, acid is generated from the acid-generator component, and the action of this acid causes an increase in the solubility of the resin component in an alkali developing solution, making the exposed portions soluble in the alkali developing solution. Thus, by conducting alkali developing, the unexposed portions remain to form a positive resist pattern.

As the resin component, a resin that exhibits increased polarity by the action of acid is generally used. When the polarity increases, the solubility of the resin in an alkali developing solution is increased, whereas the solubility of the resin in an organic solvent decreases. Therefore, when such a base resin is applied to a solvent developing process using a developing solution containing an organic solvent (organic developing solution) instead of an alkali developing process, the solubility of the exposed portions in an organic developing solution is decreased. As a result, in the solvent developing process, the unexposed portions of the resist film are dissolved and removed by the organic developing solution, and a negative resist pattern in which the exposed portions are remaining is formed. Such a solvent developing process for forming a negative-tone resist composition is sometimes referred to as "negative-tone developing process" (for example, see Patent Document 1).

Currently, resins that contain structural units derived from (meth)acrylate esters within the main chain (acrylic resins) are now widely used as base resins for resist compositions that use ArF excimer laser lithography, as they exhibit excellent transparency in the vicinity of 193 nm (for example, see Patent Document 2).

Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

The base resin contains a plurality of structural units for improving lithography properties and the like. For example, in the case of a positive-type resist, a base resin containing a structural unit having an acid decomposable group that is dissociated by the action of acid generated from the acid-generator component (e.g., a group that contains an acid dissociable group), a structural unit having a polar group such as a hydroxy group, a structural unit having a lactone-ring structure (—O—C(O)—), and the like is typically used. In recent years, instead of a structural unit containing a lactone-ring structure, a structural unit containing a sultone ring (—O—$SO_2$—) has been used. These structural units enhance the adhesion to a substrate, and contribute to suppressing pattern collapse, thereby attracting attention (see for example, Patent Document 3).

DOCUMENTS OF RELATED ART

Patent Document

[Patent Document 1] Japanese Unexamined Patent Application, First Publication No. 2009-25707

[Patent Document 2] Japanese Unexamined Patent Application, First Publication No. 2003-241385

[Patent Document 3] Japanese Unexamined Patent Application, First Publication No. 2009-62491

SUMMARY OF THE INVENTION

As further progress is made in lithography techniques and miniaturization of resist patterns, further improvement in resist materials has been demanded in terms of not only various lithography properties, but also reducing defects. The term "defects" refers to general deficiencies within a resist film that are detected when observed from directly above the developed resist pattern using, for example, a surface defect detection apparatus (product name: "KLA") manufactured by KLA-TENCOR Corporation. Examples of these deficiencies include deficiencies caused by adhesion of foreign matters and precipitates on the surface of the resist pattern, such as post-developing scum (residual resist), foam and dust; deficiencies related to resist pattern shape, such as bridges formed between line patterns, and filling-up of holes of a contact hole pattern; and color irregularities of a pattern.

In the case where a resist composition containing a resin component having a sultone ring and an acid decomposable group as described in Patent Document 3 is used, it is preferable that the above effects in terms of adhesion to a substrate and suppression of pattern collapse can be achieved, thereby enabling miniaturization of resist patterns.

However, with respect to a resin component having a sultone ring and an acid decomposable group, decomposition of the side chain is sometimes observed in the production of the resin component. Due to the influence of such decomposition, there was still room for reducing defects and improving lithography properties in the formation of a resist pattern using a resist composition containing such resin component.

The present invention takes the above circumstances into consideration, with an object of providing a method of producing a polymeric compound useful as a base component for a resist composition which enables to reduce generation of defects and achieve excellent lithography properties, a resist composition including the polymeric compound, and a method of forming a resist pattern using the resist composition.

As a result of intensive studies, the present inventors have found that, in the production of a resin using a monomer containing an acid decomposable group and a monomer containing a sultone ring, the acid decomposable group may be decomposed by the influence of the sultone ring, and such decomposition can be suppressed by the presence of a basic compound. The present invention has been completed based on these findings.

Specifically, a first aspect of the present invention is a method of producing a polymeric compound, including: copolymerizing a monomer containing an —$SO_2$— containing cyclic group with a monomer containing an acid decomposable group which exhibits increased polarity by the action of acid, thereby obtaining the polymeric compound, provided that the polymeric compound comprises no structural unit derived from a monomer that generates acid upon exposure, wherein the copolymerizing is conducted in the presence of 0.001 to 1.0 mol % of a basic compound, based on the monomer containing an —$SO_2$— containing cyclic group.

A second aspect of the present invention is a resist composition including a polymeric compound produced by the method according to the first aspect.

A third aspect of the present invention is a method of forming a resist pattern, including: using a resist composition according to the second aspect to form a resist film on a substrate, subjecting the resist film to exposure, and subjecting the resist film to developing to form a resist pattern.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

An "acrylate ester" refers to a compound in which the terminal hydrogen atom of the carboxy group of acrylic acid ($CH_2$=CH—COOH) has been substituted with an organic group.

In the present specification, acrylic acid or an acrylate ester having the hydrogen atom bonded to the carbon atom on the α-position substituted with a substituent is sometimes referred to as "α-substituted acrylic acid" or "α-substituted acrylate ester". Further, acrylic acid and α-substituted acrylic acid are collectively referred to as "(α-substituted) acrylic acid", and acrylate esters and α-substituted acrylate esters are collectively referred to as "(α-substituted) acrylate ester".

Examples of the substituent bonded to the carbon atom on the α-position of an α-substituted acrylic acid or an ester thereof include an alkyl group of 1 to 5 carbon atoms, a halogenated alkyl group of 1 to 5 carbon atoms and a hydroxyalkyl group. With respect to the "structural unit derived from an acrylate ester", the "α-position (the carbon atom on the α-position)" refers to the carbon atom having the carbonyl group bonded thereto, unless specified otherwise.

Examples of the halogen atom as the substituent on the α-position include a fluorine atom, a chlorine atom, a bromine atom and an iodine atom.

Specific examples of the alkyl group of 1 to 5 carbon atoms for the substituent on the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms as a substituent on the α-position include groups in which part or all of the hydrogen atoms of the aforementioned alkyl group of 1 to 5 carbon atoms are substituted with halogen atoms. Examples of the halogen atom include a fluorine atom, a chlorine atom, a bromine atom and an iodine atom, and a fluorine atom is particularly desirable.

Specific examples of the hydroxyalkyl group as a substituent on the α-position include groups in which part or all of the hydrogen atoms of the aforementioned alkyl group of 1 to 5 carbon atoms are substituted with a hydroxy group.

In the present invention, it is preferable that a hydrogen atom, an alkyl group of 1 to 5 carbon atoms or a halogenated alkyl group of 1 to 5 carbon atoms is bonded to the α-position of an (α-substituted) acrylic acid or an ester thereof, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

An "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

The organic group which the (α-substituted) acrylic acid or an ester thereof has is not particularly limited, and examples thereof include a characteristic group such as the aforementioned aromatic group, a polarity conversion group, and an acid decomposable group described later; and a characteristic group-containing group having a characteristic group in the structure thereof. Examples of the characteristic group-containing group include groups in which the aforementioned characteristic group is bonded to a divalent linking group. As the divalent linking group, the same divalent linking groups as those described later for $R^2$ in formula (I) can be mentioned.

Examples of "acrylamide and derivatives thereof" include acrylamide in which the hydrogen atom bonded to the carbon atom on the α-position may be substituted with a substituent (hereafter, sometimes referred to as "(α-substituted)" acrylamide), and a compound in which either or both terminal hydrogen atoms on the amino group of acrylamide is substituted with a substituent.

As the substituent to be bonded to the carbon atom on the α-position of acrylamide and derivatives thereof, the same substituents as those described above for the substituent to be bonded to the carbon atom on the α-position of an α-substituted acrylate ester can be mentioned.

As the substituent which substitutes either or both terminal hydrogen atoms on the amino group of acrylamide, an organic group is preferable. The organic group is not particularly limited, and examples thereof include the same organic groups as those described above for (α-substituted) acrylate ester.

Examples of the compound in which in which either or both terminal hydrogen atoms on the amino group of (α-substituted) acrylamide is substituted with a substituent include a compound in which —C(=O)—O— bonded to the carbon atom on the α-position of the aforementioned (α-substituted) acrylate ester is replaced by —C(=O)—N($R^b$)— (in the formula, $R^b$ represents a hydrogen atom or an alkyl group of 1 to 5 carbon atoms).

In the formula, the alkyl group for $R^b$ is preferably linear or branched.

A "vinyl aromatic compound" is a compound having an aromatic ring and one vinyl group bonded to the aromatic ring, and examples thereof include styrene and derivatives thereof, and vinylnaphthalene and derivatives thereof.

As the substituent to be bonded to the carbon atom on the α-position of the vinyl aromatic compound (i.e., the carbon atom of the vinyl group which is bonded to the aromatic ring), the same substituents as those described above for the substituent to be bonded to the carbon atom on the α-position of an α-substituted acrylate ester can be mentioned.

Herebelow, a vinyl aromatic compound in which the hydrogen atom bonded to the carbon atom on the α-position is substituted with a substituent is sometimes referred to as "(α-substituted) vinyl aromatic compound".

Examples of "styrene and derivatives thereof" include styrene which may have the hydrogen atom bonded to the carbon atom on the α-position substituted with a substituent, and a hydrogen atom bonded to the benzene ring substituted with a substituent other than a hydroxy group (hereafter, sometimes referred to as "(α-substituted) styrene"); hydroxystyrene which may have the hydrogen atom bonded to the carbon atom on the α-position substituted with a substituent, and a hydrogen atom bonded to the benzene ring substituted with a substituent other than a hydroxy group (hereafter, sometimes referred to as "(α-substituted) hydroxystyrene"); a compound in which the hydrogen atom within the hydroxy group of (α-substituted) hydroxystyrene is substituted with an organic group; vinylbenzoic acid which may have the hydrogen atom bonded to the carbon atom on the α-position substituted with a substituent, and a hydrogen atom bonded to the benzene ring substituted with a substituent other than a hydroxy group and a carboxy group (hereafter, sometimes referred to as "(α-substituted) vinylbenzoic acid"); and a compound in which the hydrogen atom within the carboxy group of (α-substituted) vinylbenzoic acid is substituted with an organic group.

Hydroxystyrene is a compound which has 1 vinyl group and at least 1 hydroxy group bonded to a benzene ring. The number of hydroxy groups bonded to the benzene ring is preferably 1 to 3, and most preferably 1. The bonding position of the hydroxy group on the benzene ring is not particularly limited. When there is 1 hydroxy group, a para-4th position from the bonding position of the vinyl group is preferable. When there are 2 or more hydroxy groups, a desired combination of the bonding positions can be used.

Vinylbenzoic acid is a compound in which one vinyl group is bonded to the benzene ring of benzoic acid.

The bonding position of the vinyl group on the benzene ring is not particularly limited.

The substituent other than a hydroxy group and a carboxy group which may be bonded the benzene ring of styrene or a derivative thereof is not particularly limited, and examples thereof include a halogen atom, an alkyl group of 1 to 5 carbon atoms, and a halogenated alkyl group of 1 to 5 carbon atoms. Examples of the halogen atom include a fluorine atom, a chlorine atom, a bromine atom and an iodine atom, and a fluorine atom is particularly desirable.

The organic group within the compound in which the hydrogen atom within the hydroxy group of (α-substituted) hydroxystyrene is substituted with an organic group is not particularly limited, and examples thereof include the same organic groups as those described above for the aforementioned (α-substituted) acrylate ester.

The organic group within the compound in which the hydrogen atom within the carboxy group of (α-substituted) vinylbenzoic acid is substituted with an organic group is not particularly limited, and examples thereof include the same organic groups as those described above for the aforementioned (α-substituted) acrylate ester.

Examples of "vinylnaphthalene and derivatives thereof" include vinylnaphthalene which may have the hydrogen atom bonded to the carbon atom on the α-position substituted with a substituent, and a hydrogen atom bonded to the naphthalene ring substituted with a substituent other than a hydroxy group (hereafter, sometimes referred to as "(α-substituted) vinylnaphthalene"); vinyl(hydroxynaphthalene) which may have the hydrogen atom bonded to the carbon atom on the α-position substituted with a substituent, and a hydrogen atom bonded to the naphthalene ring substituted with a substituent other than a hydroxy group (hereafter, sometimes referred to as "(α-substituted) vinyl(hydroxynaphthalene)"); and a compound in which the hydrogen atom within the hydroxy group of (α-substituted) vinyl(hydroxynaphthalene) is substituted with an organic group.

Vinyl(hydroxynaphthalene) is a compound which has 1 vinyl group and at least 1 hydroxy group bonded to a naphthalene ring. The vinyl group may be bonded to the 1st or 2nd position of the naphthalene ring. The number of hydroxy groups bonded to the naphthalene ring is preferably 1 to 3, and most preferably 1. The bonding position of the hydroxy group on the naphthalene ring is not particularly limited. When the vinyl group is bonded to the 1st or 2nd position of the naphthalene ring, the hydroxy group is preferably bonded to either one of the 5th to 8th position of the naphthalene ring. In particular, when the number of hydroxy group is 1, the hydroxy group is preferably bonded to either one of the 5th to 7th position of the naphthalene ring, and more preferably the 5th or 6th position. When there are 2 or more hydroxy groups, a desired combination of the bonding positions can be used.

As the substituent which may be bonded to the naphthalene ring of vinylnaphthalene and derivatives thereof, the same substituents as those described above for the substituent which may be bonded to the benzene ring of the (α-substituted) styrene can be mentioned.

The organic group within the compound in which the hydrogen atom within the hydroxy group of (α-substituted) vinyl(hydroxynaphthalene) is substituted with an organic group is not particularly limited, and examples thereof include the same organic groups as those described above for the aforementioned (α-substituted) acrylate ester.

The term "exposure" is used as a general concept that includes irradiation with any form of radiation.

According to the present invention, there are provided a method of producing a polymeric compound useful as a base component for a resist composition which enables to reduce generation of defects and achieve excellent lithography properties, a resist composition including the polymeric compound, and a method of forming a resist pattern using the resist composition.

MODE FOR CARRYING OUT THE INVENTION

<<Production Method of Polymeric Compound>>

The method of producing a polymeric compound according to a first aspect of the present invention (hereafter, sometimes referred to simply as "production method") includes: copolymerizing a monomer containing an —$SO_2$— containing cyclic group with a monomer containing an acid decomposable group which exhibits increased polarity by the action of acid, thereby obtaining the polymeric compound, provided that the polymeric compound comprises no structural unit derived from a monomer that generates acid upon exposure, wherein the copolymerizing is conducted in the presence of 0.001 to 1.0 mol % of a basic compound, based on the monomer containing an —$SO_2$— containing cyclic group.

In the present specification, a "polymeric compound" refers to a polymer having a molecular weight of 1,000 or more. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

Specifically, a polymeric compound can be produced by dissolving at least a monomer containing an —$SO_2$— containing cyclic group and a monomer containing an acid decomposable group which exhibits increased polarity by the action of acid in a polymerization solvent, followed by adding a polymerization initiator and conducting polymerization in the presence of a basic compound.

In the polymerization, by using a chain transfer agent such as HS—$CH_2$—$CH_2$—$CH_2$—$C(CF_3)_2$—OH, a —$C(CF_3)_2$—OH group can be introduced. Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The monomer containing an —$SO_2$— containing cyclic group and the monomer containing an acid decomposable group which exhibits increased polarity by the action of acid will be described later.

In the present invention, in addition to the monomer containing an —$SO_2$— containing cyclic group and the monomer containing an acid decomposable group which exhibits increased polarity by the action of acid, a monomer for deriving a structural unit to be introduced to the polymeric compound may be used if desired. However, in the production method of the present invention, a monomer which generates acid upon exposure is not used. By virtue of not using a monomer which generates acid upon exposure, in the production of a polymeric compound, no acid is generated from the monomers, which may decompose the acid decomposable group during the production of the polymeric compound. Therefore, in the present invention, by using 0.001 to 1.0 mol % of a basic compound, based on the monomer containing an —$SO_2$— containing cyclic group, a polymeric compound preferable as a base component of a resist composition can be produced.

The monomer for deriving a structural unit to be introduced to the polymeric compound if desired is not particularly limited, as long as it is copolymerizable with the monomer containing an —$SO_2$— containing cyclic group and the monomer containing an acid decomposable group which exhibits increased polarity by the action of acid. Specific examples of such monomer include monomers for deriving structural units (a2) to (a6) described later. As the monomer, a commercially available monomer may be used, or the monomer may be synthesized by a conventional method.

The amount of each monomer (the monomer containing an —$SO_2$— containing cyclic group, the monomer containing an acid decomposable group which exhibits increased polarity by the action of acid and monomer(s) for deriving structural unit(s) to be introduced to the polymeric compound if desired) can be appropriately selected depending on the copolymer compositional ratio, i.e., the ratio of the structural units in the polymeric compound. The copolymer compositional ratio of the polymeric compound to be used as a base component of a resist composition will be described later in the explanation of the second aspect.

The polymerization initiator is not particularly limited, and examples thereof include azobisisobutyronitrile (AIBN) and dimethyl 2,2'-azobis(isobutyrate).

The polymerization solvent is capable of dissolving raw materials, i.e., the monomer containing an —$SO_2$— containing cyclic group, the monomer containing an acid decomposable group which exhibits increased polarity by the action of acid and monomer(s) for deriving structural unit(s) to be introduced to the polymeric compound if desired, and examples thereof include ethyl lactate, γ-butyrolactone, methyl ethyl ketone, propylene glycol monomethylether acetate, tetrahydrofuran, and a mixed solvent containing any of these solvents.

Specific examples of the basic compound will be described later.

The basic compound may be further added to the polymerization solvent having the monomers and the polymerization initiator added thereto; the basic compound may be added to the polymerization solvent together with the monomers and the polymerization initiator; or the basic compound may be added to a monomer solution of any of the monomers in advance. It is preferable that the basic compound be present when the monomer containing an —$SO_2$— containing cyclic group comes into contact with the monomer containing an acid decomposable group which exhibits increased polarity by the action of acid, and it is more preferable that the basic compound be added to a solution having the monomer containing an —$SO_2$— containing cyclic group dissolved therein in advance.

The amount of the basic compound used, based on the monomer containing an —$SO_2$— containing cyclic group is 0.001 to 1.0 mol %, preferably 0.001 to 0.5 mol %, more preferably 0.005 to 0.1 mol %, and most preferably 0.01 to 0.1 mol %. When the amount of the basic compound is at least as large as 0.001 mol %, decomposition of the acid decomposable group caused by the influence of the monomer containing an —$SO_2$— containing cyclic group can be suppressed. On the other hand, when the amount of the basic compound is no more than 1.0 mol %, decomposition of bonds within the monomers used (e.g., ester bond and the like) caused by excess basic compound can be suppressed, and retention of the basic compound after the synthesis of the polymeric compound can be suppressed.

The reaction temperature is preferably within the range of 50 to 100° C., and more preferably 65 to 85° C.

The reaction time varies, depending on the reactivity of the monomers, the reaction temperature, and the like. However, in general, the reaction time is preferably 60 to 480 minutes, and more preferably 120 to 420 minutes.

After polymerizing the monomers, for example, the reacted polymer solution is dropwise added to excess water or organic solvent (isopropanol, hexane, heptane, methanol or the like) so as to precipitate a polymeric compound, followed by filtration, thereby obtaining the polymeric compound.

Further, it is also preferable to wash the thus obtained polymeric compound with an organic solvent. Specifically, after allowing an organic solvent or the like to come into contact with the polymeric compound, filtration, drying and the like are conducted, thereby conducting the washing. Depending on the organic solvent used, unreacted monomers can be removed, or the basic compound can be removed. For example, in the case where triethylamine or aniline is used as the basic compound, an alcohol solvent such as ethanol can be used as the washing solvent, so as to remove the basic compound after the production of the polymeric compound.

Furthermore, if desired, the synthesized, washed polymeric compound can be separated and purified. The separation and purification can be conducted by a conventional method. For example, any one of concentration, solvent extraction, distillation, crystallization, recrystallization and chromatography can be used alone, or two or more of these methods may be used in combination.

(Monomer Containing —$SO_2$— Containing Cyclic Group)

The monomer containing an —$SO_2$— containing cyclic group becomes a repeating unit (structural unit) which constitutes the polymeric compound in the production method of the present invention. By virtue of containing an —$SO_2$— containing cyclic group, the polymeric compound obtained by the production method of the present invention improves the adhesion of the resist film formed using a resist composition containing the polymeric compound to a substrate. Further, the —$SO_2$— containing cyclic group contributes to improvement in various lithography properties such as sensitivity, resolution, exposure latitude (EL margin), line width roughness (LWR), line edge roughness (LER) and mask reproducibility.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group.

In the —$SO_2$— containing cyclic group, the ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings.

The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO$_2$— containing cyclic group include groups represented by general formulas (3-1) to (3-4) shown below.

[Chemical Formula 1]

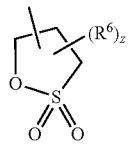

(3-1)

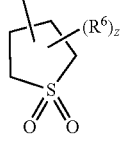

(3-2)

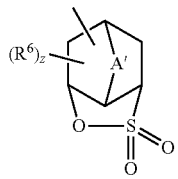

(3-3)

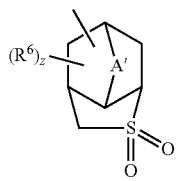

(3-4)

In the formulas, A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$— —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of $R^6$ may be the same or different from each other.

As the alkyl group, alkoxy group, halogenated alkyl group, —COOR", —OC(=O)R" and hydroxyalkyl group for $R^6$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 2]

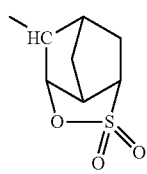

(3-1-1)

(3-1-2) 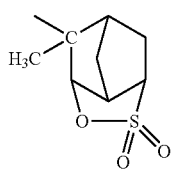
(3-1-3) 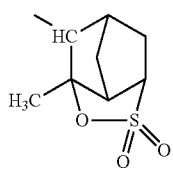
(3-1-4) 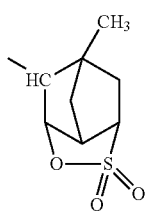
(3-1-5) 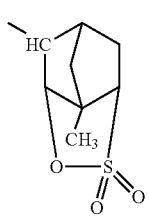
(3-1-6) 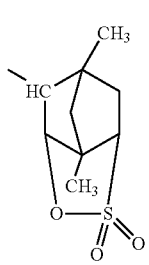
(3-1-7) 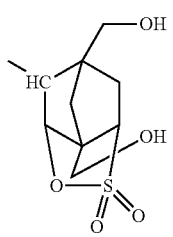
(3-1-8) 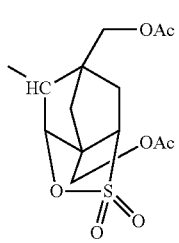
(3-1-9) 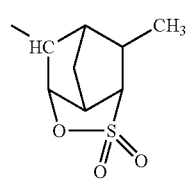
(3-1-10) 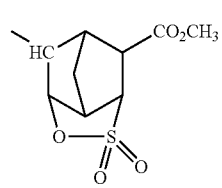
(3-1-11) 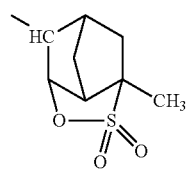
(3-1-12) 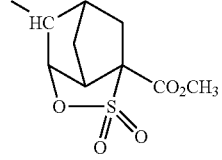
(3-1-13) 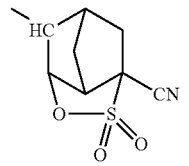
(3-1-14) 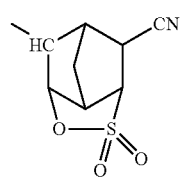
(3-1-15) 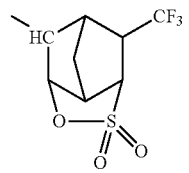
(3-1-16) 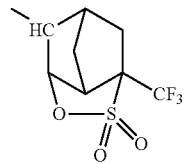

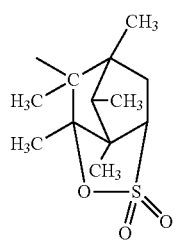 (3-1-17)
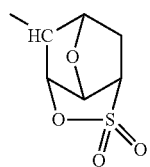 (3-1-18)
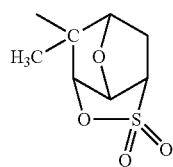 (3-1-19)
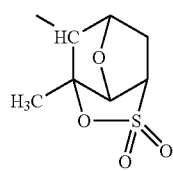 (3-1-20)
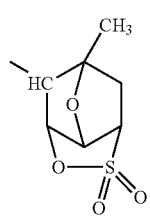 (3-1-21)
[Chemical Formula 3]
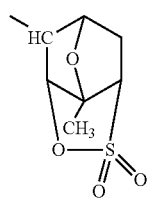 (3-1-22)
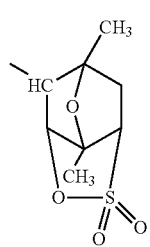 (3-1-23)
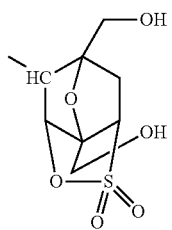 (3-1-24)
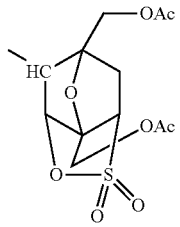 (3-1-25)
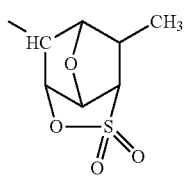 (3-1-26)
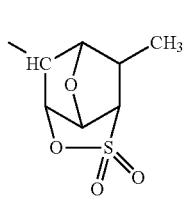 (3-1-27)
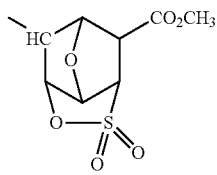 (3-1-28)
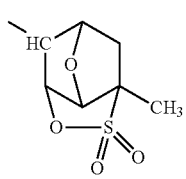 (3-1-29)
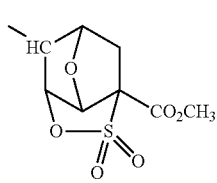 (3-1-30)
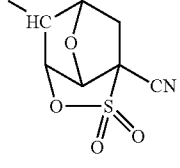 (3-1-31)
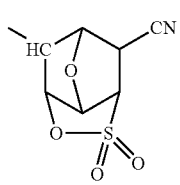
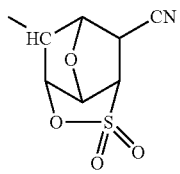

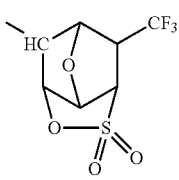
(3-1-32)

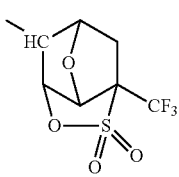
(3-1-33)

[Chemical Formula 4]

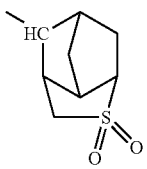
(3-2-1)

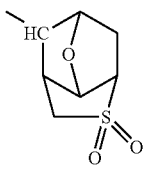
(3-2-2)

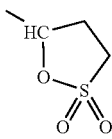
(3-3-1)

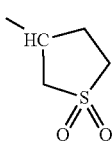
(3-4-1)

As the —$SO_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

As the monomer containing an —$SO_2$— containing cyclic group, there is no particular limitation as long as it contains an —$SO_2$— containing cyclic group, but is preferably a compound having an ethylenic double bond. When a compound having an ethylenic double bond is used, a structural unit in which the ethylenic double bond has been cleaved to be converted into a single bond can constitute the polymeric compound.

Examples of the monomer having an ethylenic double bond and containing an —$SO_2$— containing cyclic group include an (α-substituted) acrylate ester containing an —$SO_2$— containing cyclic group, an (α-substituted) acrylamide derivative containing an —$SO_2$— containing cyclic group, and a vinylaromatic compound containing an —$SO_2$— containing cyclic group.

Among these, an (α-substituted) acrylate ester containing an —$SO_2$— containing cyclic group or an (α-substituted) acrylamide derivative containing an —$SO_2$— containing cyclic group is preferable, and specific examples thereof include a compound represented by general formula (I) shown below.

[Chemical Formula 5]

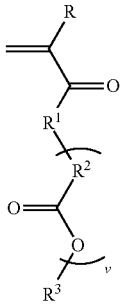
(I)

In the formula, R represents a hydrogen atom, an alkyl group of 1 to 5 carbon atoms or a halogenated alkyl group of 1 to 5 carbon atoms; $R^1$ represents —O— or —NH—; $R^2$ represents a divalent linking group; $R^3$ represents an —$SO_2$— containing cyclic group; and v represents 0 or 1.

In formula (I), R represents a hydrogen atom, an alkyl group of 1 to 5 carbon atoms or a halogenated alkyl group of 1 to 5 carbon atoms.

The alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be used as the substituent for the α-position.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (I), $R^1$ represents —O— or —NH—, and preferably —O—.

In the formula (I), the divalent linking group for $R^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with a substituent (a group or an atom other than hydrogen).

The hydrocarbon group for $R^2$ may be either an aliphatic hydrocarbon group, or an aromatic hydrocarbon group.

An "aliphatic hydrocarbon group" refers to a hydrocarbon group that has no aromaticity.

The divalent aliphatic hydrocarbon group as the divalent hydrocarbon group for $R^2$ may be either saturated or unsaturated. In general, the divalent aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$-], a trimethylene group [—(CH$_2$)$_3$-], a tetramethylene group [—(CH$_2$)$_4$-] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (═O).

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

The aromatic hydrocarbon group is a hydrocarbon group having an aromatic ring.

The aromatic hydrocarbon group as the divalent hydrocarbon group for R$^2$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

The aromatic hydrocarbon group may or may not have a substituent. For example, the hydrogen atom bonded to the aromatic hydrocarbon ring within the aromatic hydrocarbon group may be substituted with a substituent. Examples of substituents include an alkyl group, an alkoxy group, a halogen atom, a halogenated alkyl group, a hydroxyl group and an oxygen atom (═O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

With respect to a "divalent linking group containing a hetero atom" for R$^2$, a hetero atom is an atom other than carbon and hydrogen, and examples thereof include an oxygen atom, a nitrogen atom, a sulfur atom and a halogen atom.

Examples of the divalent linking group containing a hetero atom include —O—, —C(═O)—O—, —C(═O)—, —O—C(═O)—O—, —C(═O)—NH—, —NH— (H may be substituted with a substituent such as an alkyl group or an acyl group), —S—, —S(═O)$_2$—, —S(═O)$_2$—O—, —NH—C(═O)—, ═N—, and a group represented by general formula —Y$^{25}$—O—Y$^{26}$—, —[Y$^{25}$—C(═O)—O]$_{m'}$—Y$^{26}$— or —Y$^{25}$—O—C(═O)—Y$^{26}$— [wherein Y$^{25}$ and Y$^{26}$ each independently represents a divalent hydrocarbon group which may have a substituent, O represents an oxygen atom, and m' represents an integer of 0 to 3.]

When R$^2$ represents —NH—, H may be substituted with a substituent such as an alkyl group, an aryl group (an aromatic group) or the like.

In formula —Y$^{25}$—O—Y$^{26}$, —[Y$^{25}$—C(═O)—O]$_{m'}$—Y$^{26}$— or —Y$^{25}$—O—C(═O)—Y$^{26}$—, Y$^{25}$ and Y$^{26}$ each independently represents a divalent hydrocarbon group which may have a substituent. As the divalent hydrocarbon group, the same groups as those described above for the "divalent hydrocarbon group which may have a substituent" for R$^2$ can be mentioned.

As Y$^{25}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{26}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula $—[Y^{25}—C(=O)—O]_{m'}—Y^{26}—$, m' represents an integer of 0 to 3, preferably an integer of 0 to 2, more preferably 0 or 1, and most preferably 1. Namely, it is particularly desirable that the group represented by the formula $—[Y^{25}—C(=O)—O]_{m'}—Y^{26}—$ is a group represented by the formula $—Y^{25}—C(=O)—O—Y^{26}—$. Among these, a group represented by the formula $—(CH_2)_{a'}—C(=O)—O—(CH_2)_{b'}—$ is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula $—Y^{25}—O—Y^{26}—$, $—[Y^{25}—C(=O)—O]_{m'}—Y^{26}—$ or $—Y^{25}—O—C(=O)—Y^{26}—$ is more preferable.

Among the aforementioned examples, as the divalent linking group for $R^2$, an alkylene group, a divalent alicyclic hydrocarbon group or a divalent linking group containing a hetero atom is particularly desirable. Among these, an alkylene group or a divalent linking group containing a hetero atom is more preferable, and a linear or branched alkylene group is still more preferable.

In formula (I), v represents 0 or 1, and is preferably 1. When v represents 0, it means that $(R^2—C(=O)—O)_v—$ is a single bond.

In formula (I), $R^3$ is the same as defined for the aforementioned $—SO_2—$ containing group.

In particular, as a monomer containing an $—SO_2—$ containing cyclic group, a compound represented by general formula (I-1) or (I-2) shown below is preferable, and a compound represented by general formula (I-2) shown below is more preferable.

[Chemical Formula 6]

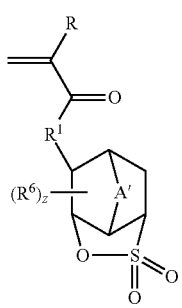

(I-1)

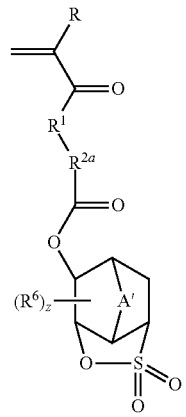

(I-2)

In the formulae, R, A', $R^1$, $R^6$ and z are the same as defined above; and $R^{2a}$ is the same as defined for $R^2$ in the aforementioned formula (I).

In formula (I-2), as $R^{2a}$, a linear or branched alkylene group or a divalent linking group containing an oxygen atom is preferable. As the linear or branched alkylene group and the divalent linking group containing an oxygen atom represented by $R^{2a}$, the same linear or branched alkylene groups and the divalent linking groups containing an oxygen atom as those described above for $R^2$ in the aforementioned formula (I) can be mentioned.

As the compound represented by formula (I-2), a compound represented by any one of general formulae (I-21) to (I-24) shown below is particularly desirable.

[Chemical Formula 7]

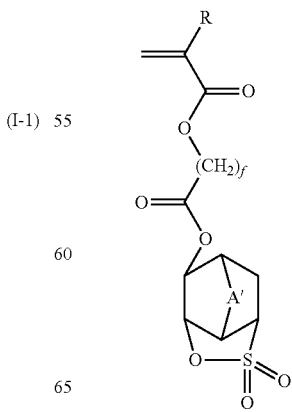

(I-21)

-continued (I-22)

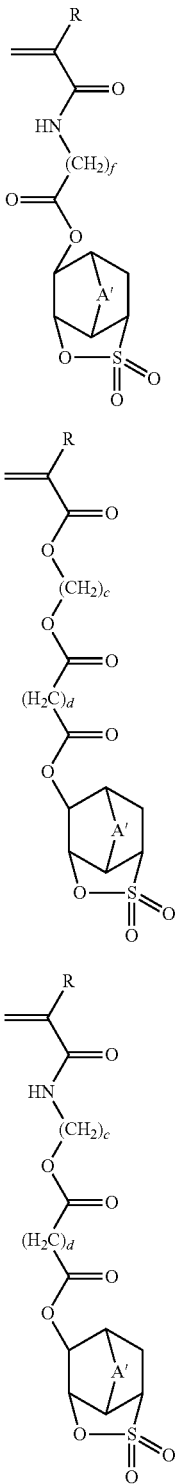

(I-23)

(I-24)

[Chemical Formula 8]

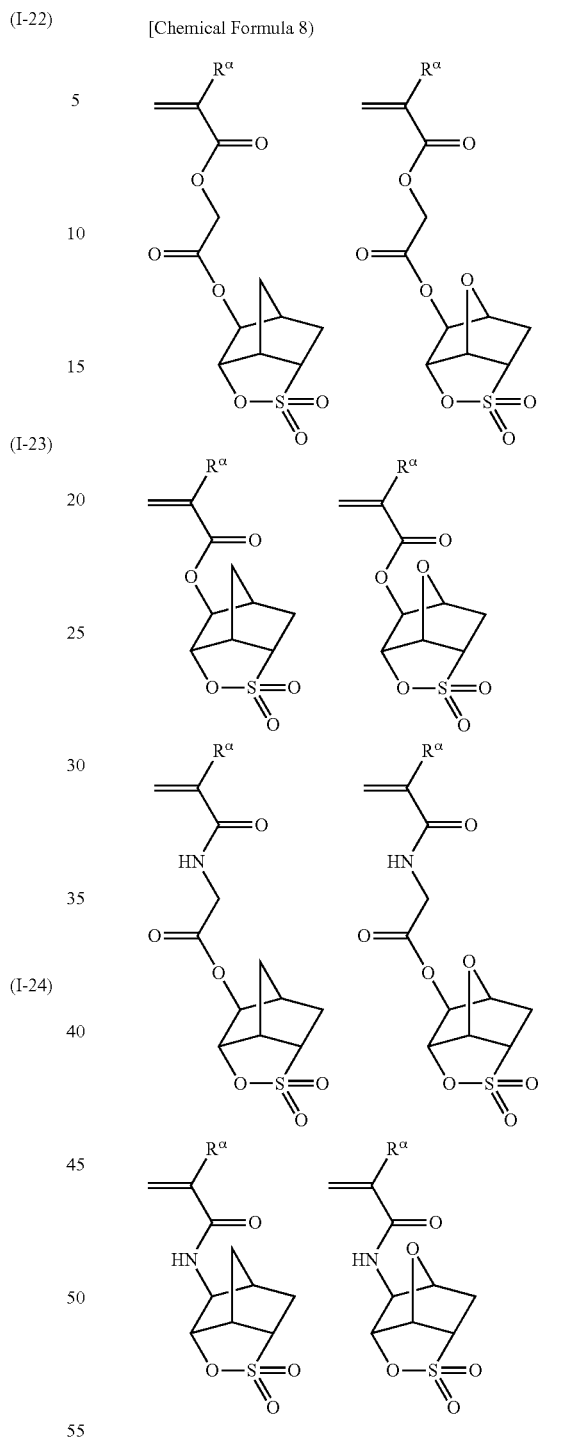

In the formulae, R and A' are the same as defined above; each of c and d independently represents an integer of 1 to 3; and each f independently represents an integer of 1 to 5 (preferably an integer of 1 to 3).

Specific examples of compounds represented by the aforementioned general formula (I-1) and (I-2) are shown below.

In the formulae shown below, $R^\alpha$ represents a hydrogen atom, a methyl group or a trifluoromethyl group.

As the monomer containing —$SO_2$— containing cyclic group used in the production method of the present invention, one type of compound may be used, or two or more types of compounds may be used in combination.

(Monomer Containing an Acid Decomposable Group that Exhibits Increased Polarity by the Action of Acid)

The term "acid decomposable group" refers to a group in which at least a part of the bond within the structure thereof is cleaved by the action of an acid (acid generated from the acid generator within the resist composition upon exposure).

Examples of acid decomposable groups which exhibit increased polarity by the action of an acid include groups which are decomposed by the action of an acid to form a polar group.

Examples of the polar group include a carboxy group, a hydroxy group, an amino group and a sulfo group ($-SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group in which at least the bond between the acid dissociable group and the adjacent carbon atom is cleaved by the action of an acid (e.g., acid generated from the acid generator within the resist composition upon exposure). It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire polymeric compound is increased. By the increase in the polarity, the solubility in an alkali developing solution changes and, the solubility in an alkali developing solution is relatively increased, whereas the solubility in a developing solution containing an organic solvent (organic solvent) is relatively decreased, thereby preferably used as a base component of a resist composition.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group ($-C(=O)-O-$). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula $-C(R^{71})(R^{72})(R^{73})$ can be given. In the formula, $R^{71}$ to $R^{73}$ are the same as defined above.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom ($=O$).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

The aliphatic cyclic group preferably has 3 to 30 carbon atoms, more preferably 5 to 30, still more preferably 5 to 20, still more preferably 6 to 15, and most preferably 6 to 12. As the monocyclic aliphatic hydrocarbon group, a group in which one or more hydrogen atoms have been removed from a monocycloalkane is preferable. The monocycloalkane preferably has 3 to 6 carbon atoms, and specific examples thereof include cyclobutane, cyclopentane and cyclohexane. As the polycyclic aliphatic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane. In these aliphatic cyclic hydrocarbon groups, part of the carbon atoms constituting the ring may be replaced with an ethereal oxygen atom ($-O-$).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group on the ring skeleton of the aliphatic cyclic group, an alkyl group can be mentioned. Examples of the alkyl group include the same groups as those represented by $R^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 9]

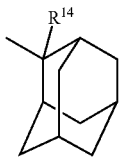
(1-1)

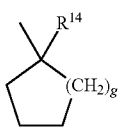
(1-2)

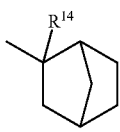
(1-3)

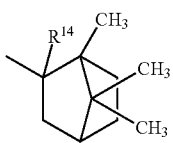
(1-4)

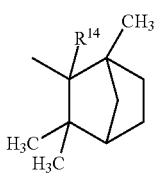
(1-5)

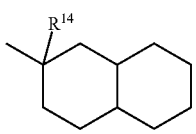
(1-6)

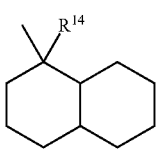
(1-7)

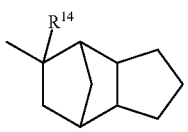
(1-8)

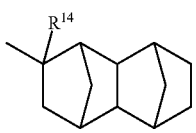
(1-9)

In the formulas above, $R^{14}$ represents an alkyl group; and g represents an integer of 0 to 8.

[Chemical Formula 10]

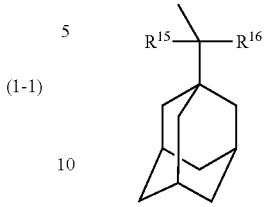
(2-1)

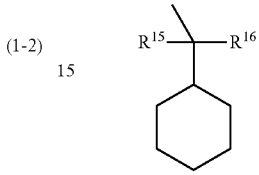
(2-2)

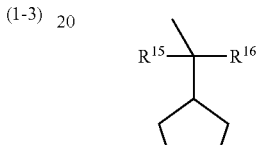
(2-3)

(2-4)

(2-5)

(2-6)

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

In formulas (2-1) to (2-6), as the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded, thereby forming an OH-containing polar group such as a carboxy group or a hydroxy group.

Examples of acetal-type acid dissociable groups include groups represented by general formula (p1) shown below.

[Chemical Formula 11]

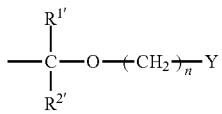

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the lower alkyl group for $R^{1'}$ and $R^{2'}$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable group (p1) is a group represented by general formula (p1-1) shown below.

[Chemical Formula 12]

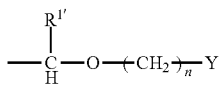

(p1-1)

In the formula, $R^{1'}$, n and Y are the same as defined above.

As the alkyl group for Y, the same alkyl groups as those described above the for the substituent which may be bonded to the carbon atom on the α-position of the aforementioned α-substituted alkylester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable group containing an aliphatic cyclic group" can be used.

Further, as the acetal-type, acid dissociable group, groups represented by general formula (p2) shown below can also be used.

[Chemical Formula 13]

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the $R^{17}$ group is bonded to the $R^{19}$ group to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, the same groups as those described above for the "aliphatic cyclic group", i.e., groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the $R^{19}$ group may be bonded to the $R^{17}$ group.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Examples of the monomer containing an acid decomposable group which exhibits increased polarity by the action of acid used in the production method of the present invention include an (α-substituted) acrylate ester monomer (II-1) containing an acid decomposable group which exhibits increased polarity by the action of acid, a monomer (II-2) in which at least a part of the hydrogen atom within the hydroxy group of hydroxystyrene or a derivative thereof is protected with a substituent containing an acid decomposable group, and a monomer (II-3) in which at least a part of the hydrogen atom within —C(=O)—OH of vinylbenzoic acid or a derivative thereof is protected with a substituent containing an acid decomposable group.

—Monomer (II-1)

Specific examples of the monomer (II-1) include a compound represented by general formula (II-11) shown below and a compound represented by general formula (II-12) shown below.

[Chemical Formula 14]

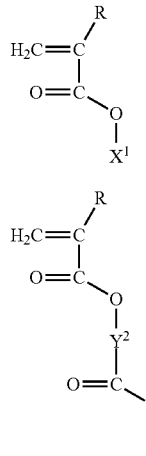

(II-11)

(II-12)

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (II-11), the alkyl group and the halogenated alkyl group for R are respectively the same as defined for the alkyl group and the halogenated alkyl group for the substituent which may be bonded to the carbon atom on the α-position of the aforementioned substituted acrylate ester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (II-12), R is the same as defined above.

$X^2$ is the same as defined for $X^1$ in formula (II-11).

As the divalent linking group for $Y^2$, the same divalent linking groups as those described above for $R^2$ in formula (I) can be mentioned.

Among these, as the divalent linking group for $Y^2$, a linear or branched alkylene group, a divalent alicyclic hydrocarbon group or a divalent linking group containing a hetero atom is particularly desirable. Among these, an alkylene group or a divalent linking group containing a hetero atom is more preferable.

Specific examples of the compound (II-1) include compounds represented by general formulae (II-1-1) to (II-1-4) shown below.

[Chemical Formula 15]

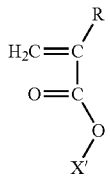

(II-1-1)

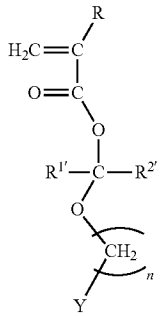

(II-1-2)

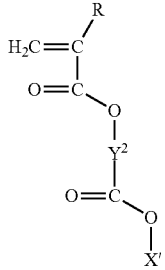

(II-1-3)

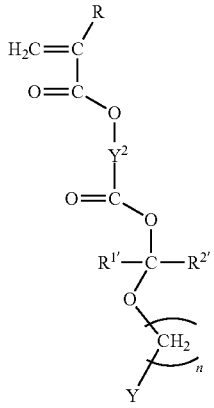

(II-1-4)

In the formulas, R, $R^{1\prime}$, $R^{2\prime}$, n, Y and $Y^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1\prime}$, $R^{2\prime}$, n and Y are respectively the same as defined for $R^{1\prime}$, $R^{2\prime}$, n and Y in general formula (p1) described above in connection with the "acetal-type acid dissociable group".

As examples of $Y^2$, the same groups as those described above for $Y^2$ in the aforementioned general formula (II-12) can be given.

Specific examples of compounds represented by the aforementioned general formulae (II-1-1) to (II-1-4) are shown below.

In the formulae shown below, $R^\alpha$ represents a hydrogen atom, a methyl group or a trifluoromethyl group.

[Chemical Formula 16]
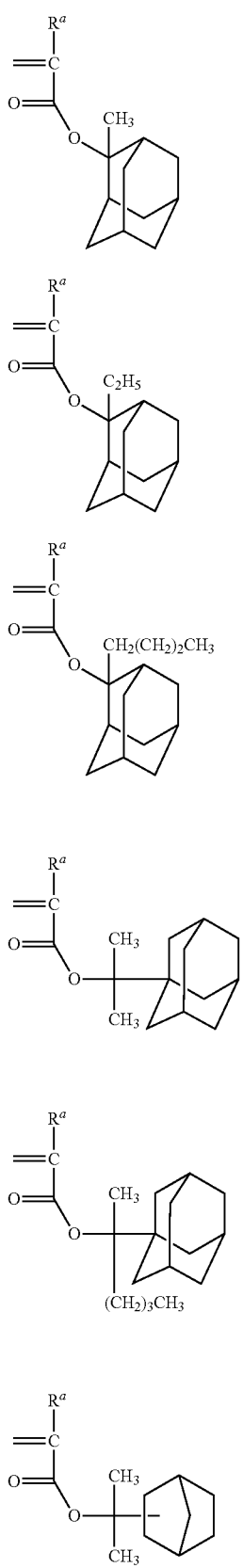
[Chemical Formula 17]
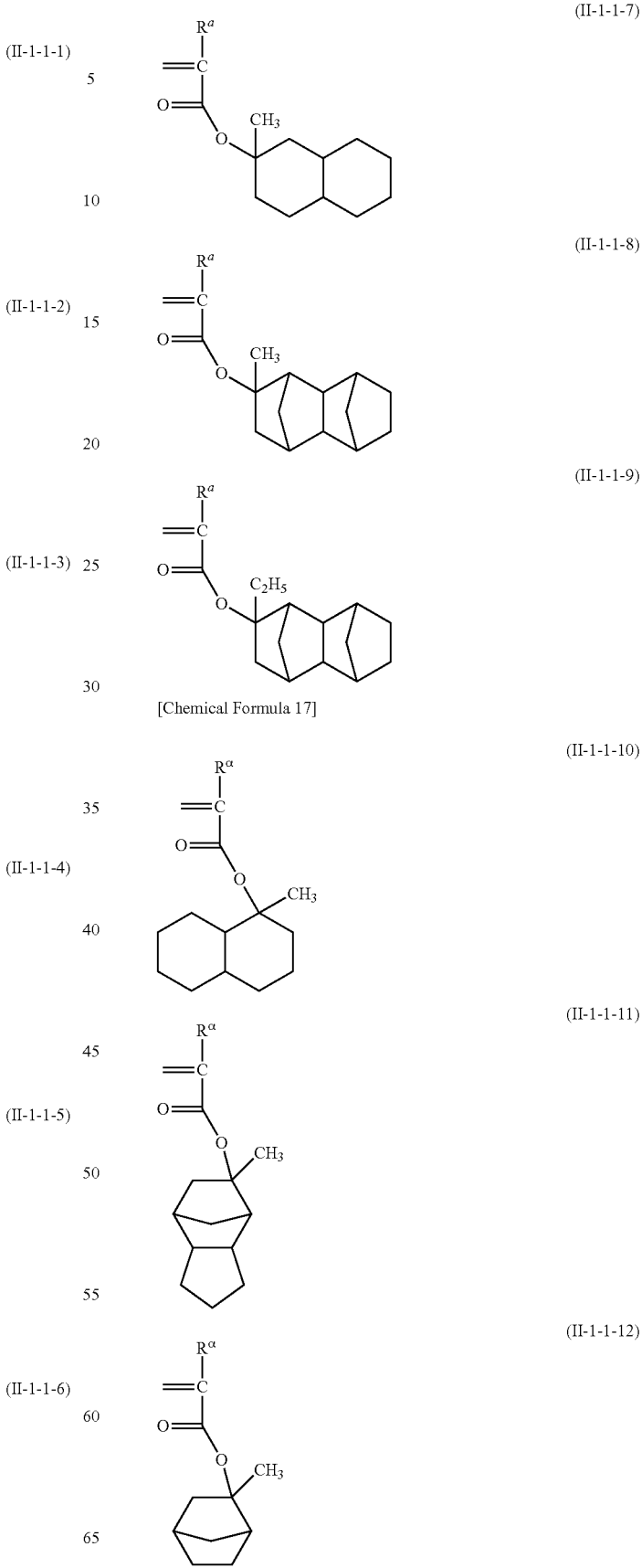

(II-1-1-13) 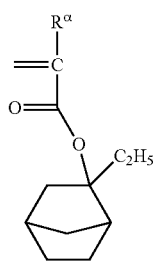
(II-1-1-14) 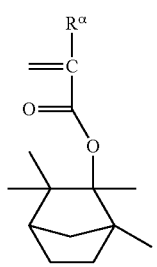
(II-1-1-15) 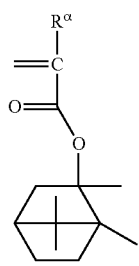
(II-1-1-16) 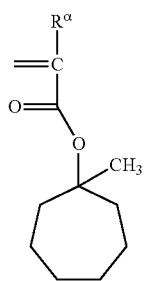
(II-1-1-17) 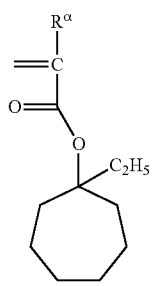
(II-1-1-18) 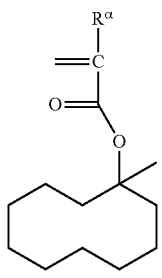
(II-1-1-19) 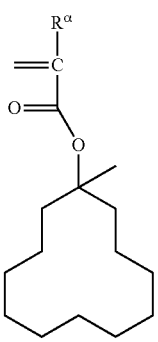
(II-1-1-20) 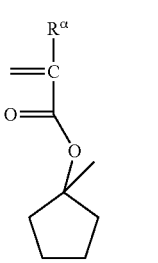
(II-1-1-21) 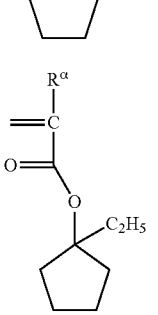
[Chemical Formula 18]
(II-1-1-22) 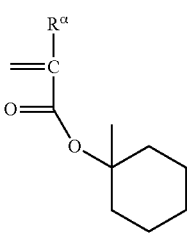
(II-1-1-23)
(II-1-1-24) 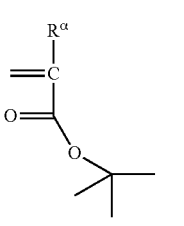

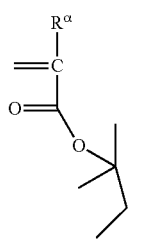
(II-1-1-25)
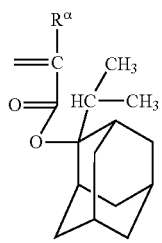
(II-1-1-26)
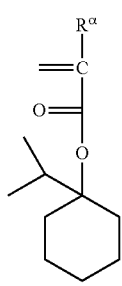
(II-1-1-27)
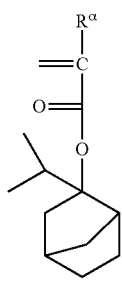
(II-1-1-28)
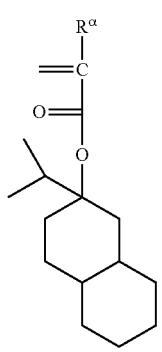
(II-1-1-29)
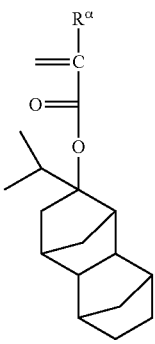
(II-1-1-30)
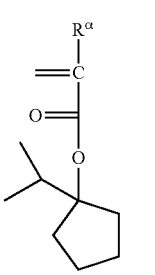
(II-1-1-31)
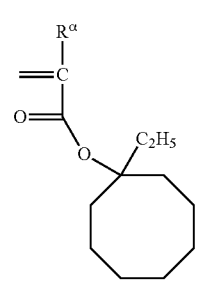
(II-1-1-32)
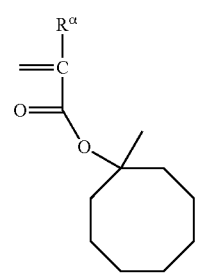
(II-1-1-33)
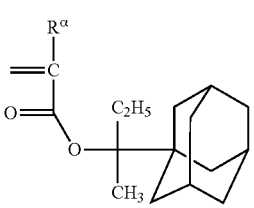
(II-1-1-34)
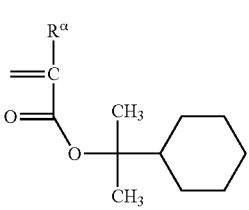
(II-1-1-35)

(II-1-1-36)
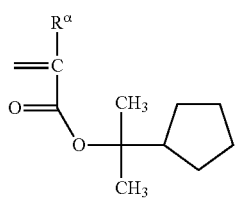
[Chemical Formula 19]
(II-1-2-1)
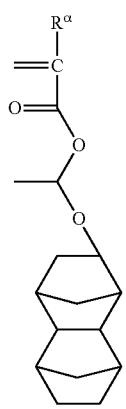
(II-1-2-2)
(II-1-2-3)
(II-1-2-4)
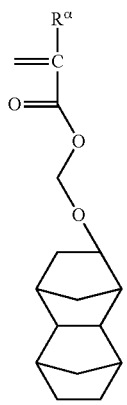
(II-1-2-5)
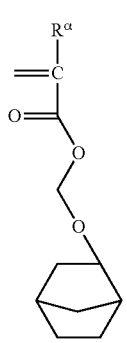
(II-1-2-6)
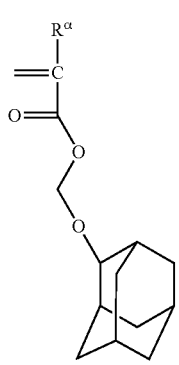
(II-1-2-7)
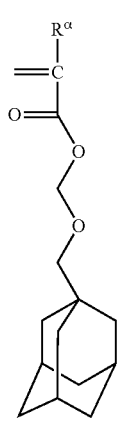

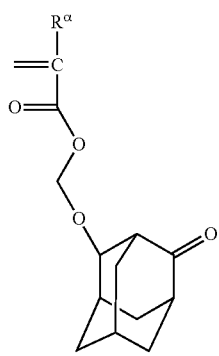 (II-1-2-8)
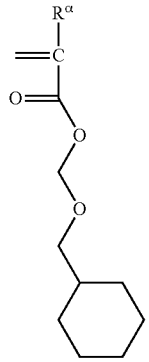 (II-1-2-12)
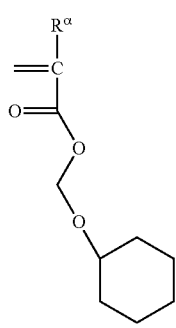 (II-1-2-9)
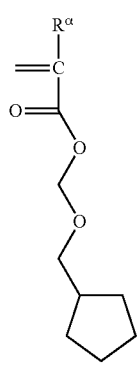 (II-1-2-13)
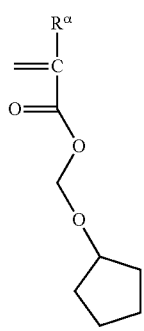 (II-1-2-10)
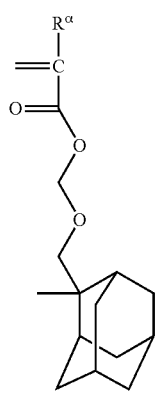 (II-1-2-14)
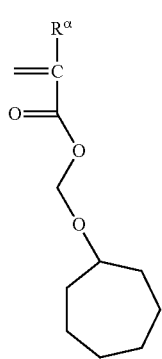 (II-1-2-11)
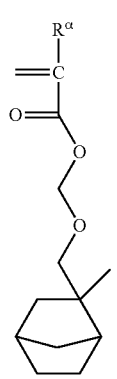 (II-1-2-15)

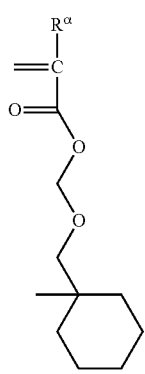 (II-1-2-16)
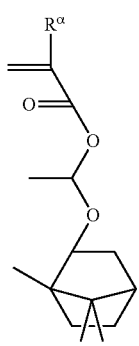 (II-1-2-17)
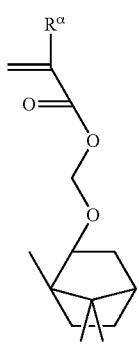 (II-1-2-18)
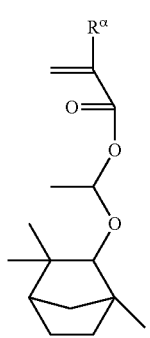 (II-1-2-19)
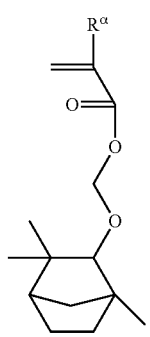 (II-1-2-20)
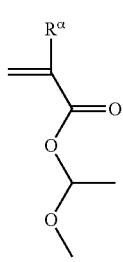 (II-1-2-21)
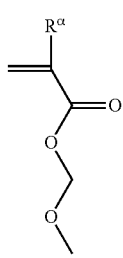 (II-1-2-22)
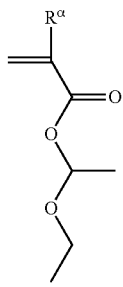 (II-1-2-23)
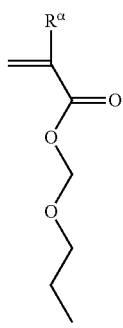 (II-1-2-24)

[Chemical Formula 20]
(11-1-3-1)
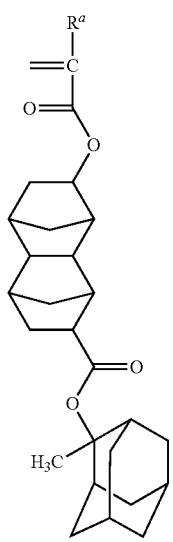
(II-1-3-2)
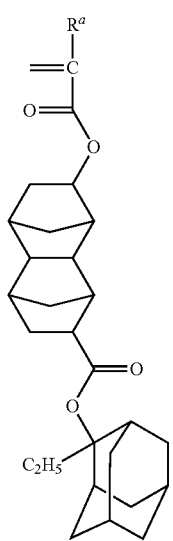
(II-1-3-3)
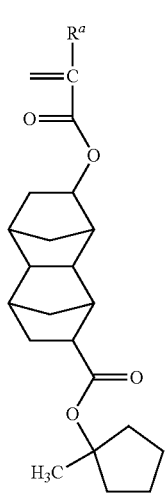
(II-1-3-4)
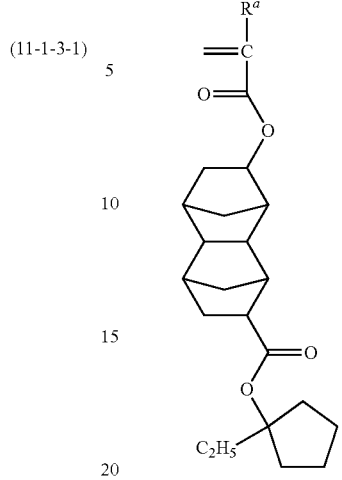
(II-1-3-5)
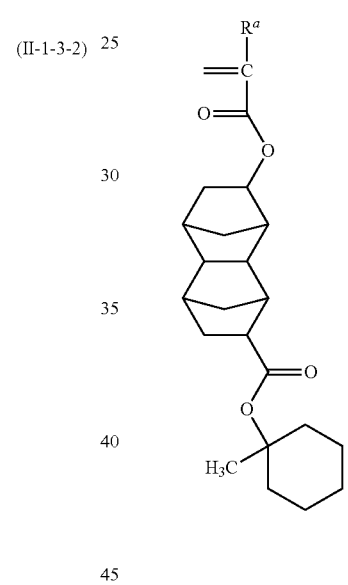
(II-1-3-6)
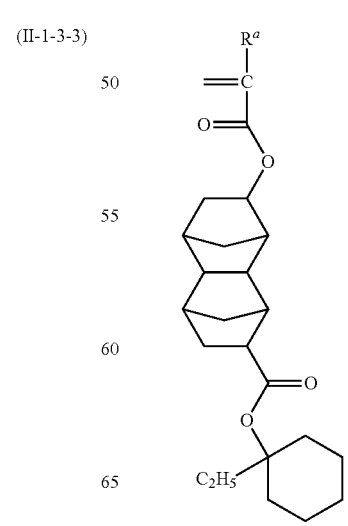

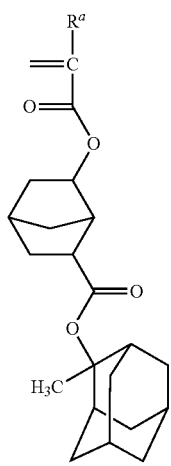
(II-1-3-7)
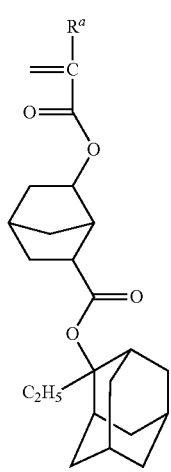
(II-1-3-8)
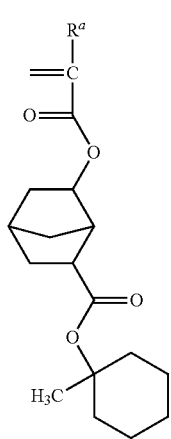
(II-1-3-9)
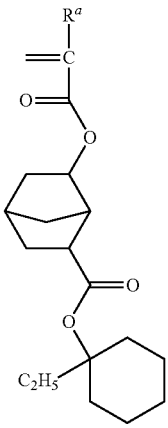
(II-1-3-10)
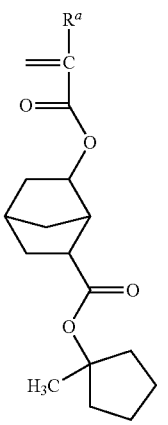
(II-1-3-11)
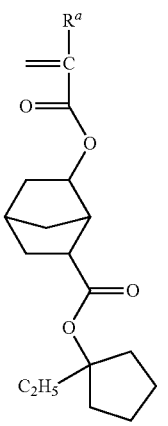
(II-1-3-12)
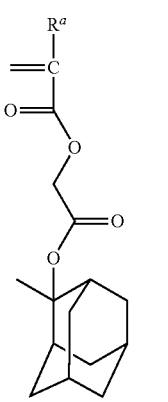
(II-1-3-13)

(II-1-3-14)
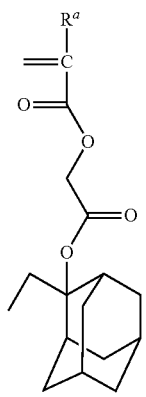
(II-1-3-15)
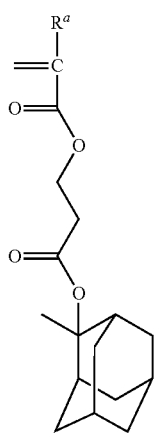
(II-1-3-16)
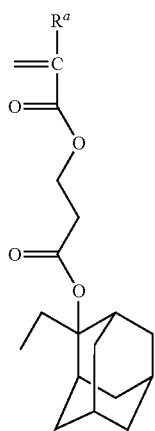
(II-1-3-17)
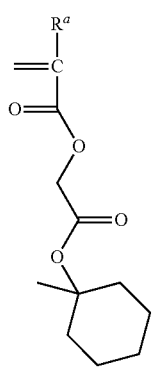
(II-1-3-18)
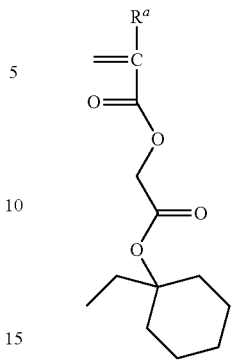
[Chemical Formula 21]
(II-1-3-19)
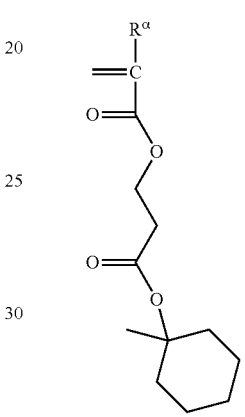
(II-1-3-20)
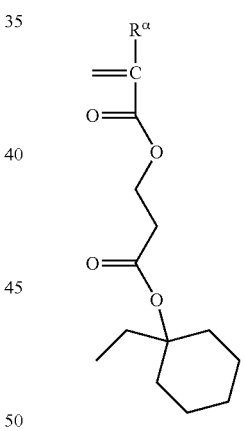
(II-1-3-21)
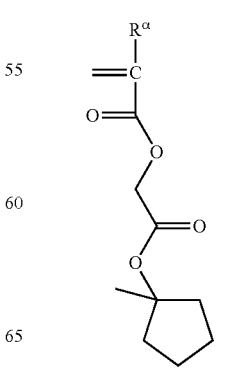

-continued
(II-1-3-22)
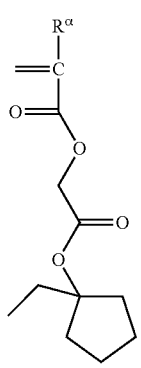
(II-1-3-23)
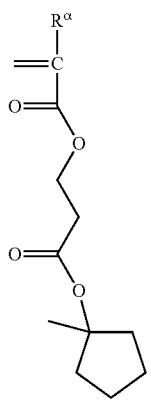
[Chemical Formula 22]
(II-1-3-25)
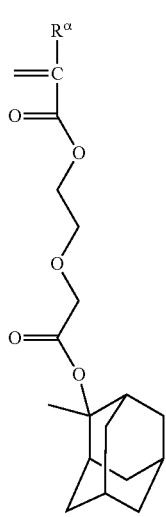
-continued
(II-1-3-26)
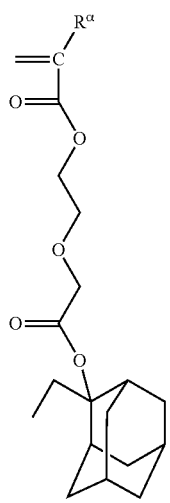
(II-1-3-24)
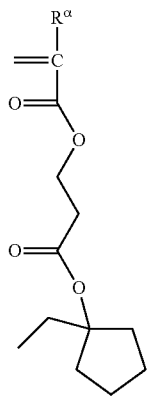
(II-1-3-27)
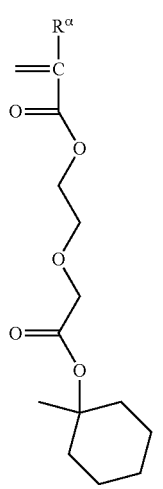
(II-1-3-28)
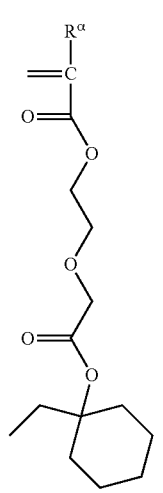

(II-1-3-29)
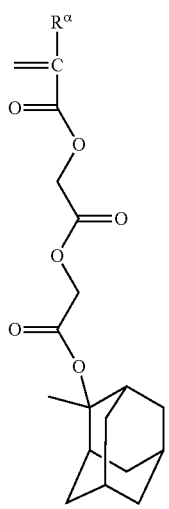
(II-1-3-30)
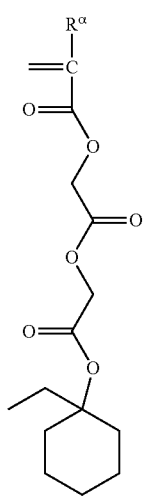
(II-1-3-31)
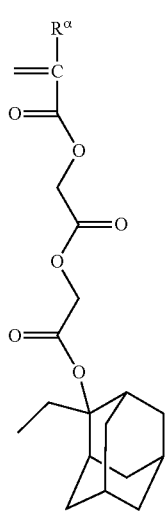
(II-1-3-32)
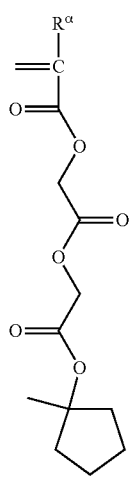
[Chemical Formula 23]
(II-1-4-1)
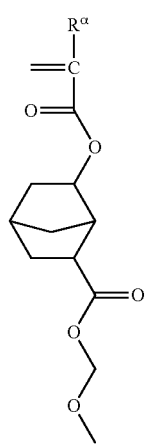
(II-1-4-2)
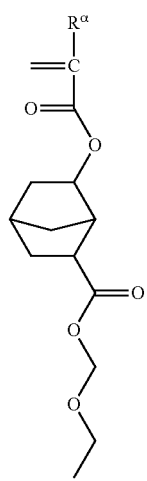

(II-1-4-3)
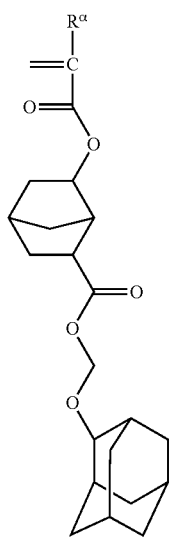
(II-1-4-4)
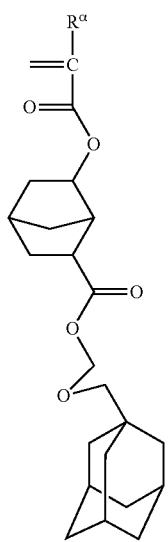
(II-1-4-5)
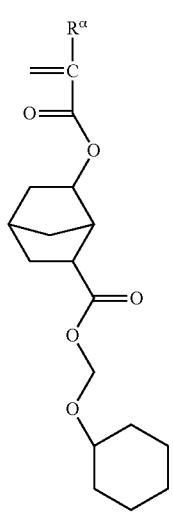
(II-1-4-6)
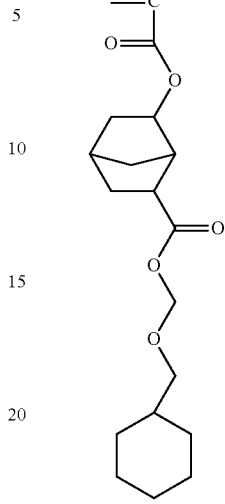
(II-1-4-7)
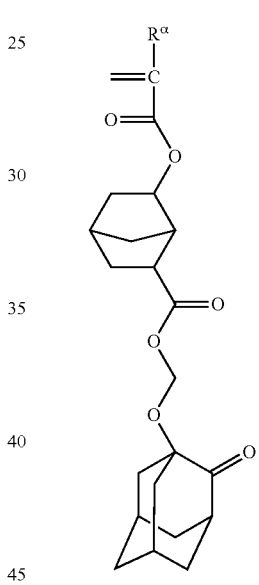
(II-1-4-8)
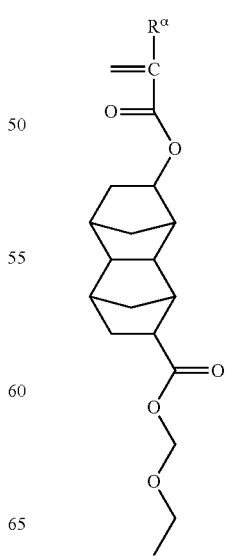

(II-1-4-9)
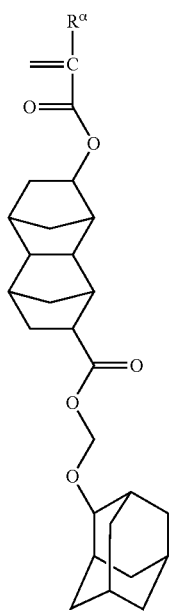
(II-1-4-10)
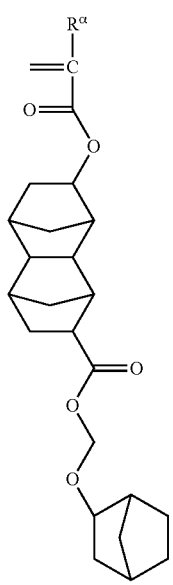
(II-1-4-11)
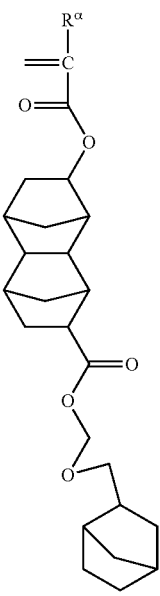
(II-1-4-12)
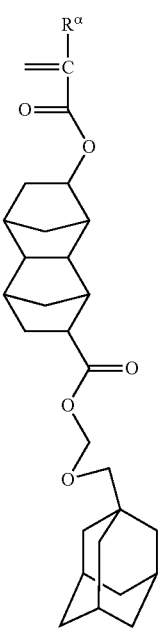

(II-1-4-13)

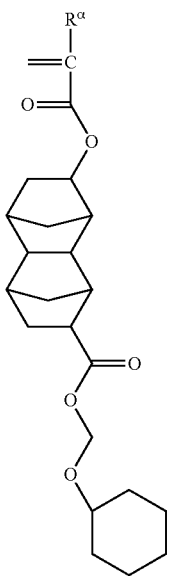

(II-1-4-15)

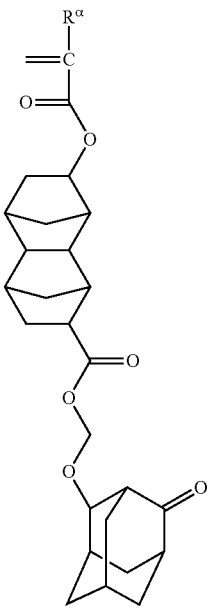

(II-1-4-14)

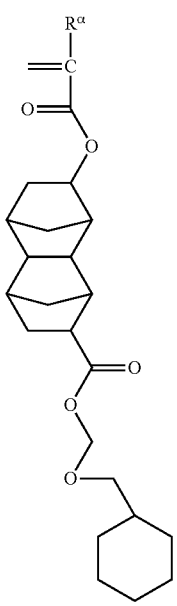

In the present invention, as the monomer (II-1), it is preferable to include at least one member selected from the group consisting of a compound represented by general formula (II-1-01) shown below, a compound represented by general formula (II-1-02) shown below, a compound represented by general formula (II-1-03) shown below, a compound represented by general formula (II-1-04) shown below, a compound represented by general formula (II-1-05) shown below, and a compound represented by general formula (II-1-06) shown below.

Among these, it is more preferable to include at least one member selected from the group consisting of a compound represented by general formula (II-1-01) shown below, a compound represented by general formula (II-1-02) shown below, a compound represented by general formula (II-1-03) shown below, a compound represented by general formula (II-1-04) shown below, and a compound represented by general formula (II-1-05) shown below.

[Chemical Formula 24]

(II-1-01)

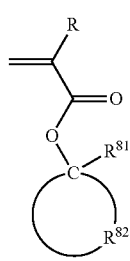

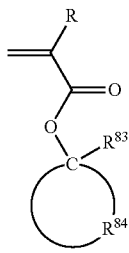 (II-1-02)

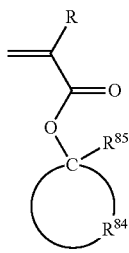 (II-1-03)

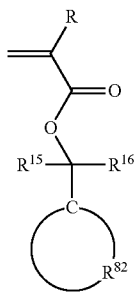 (II-1-04)

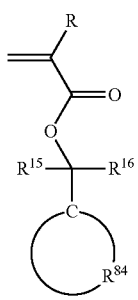 (II-1-05)

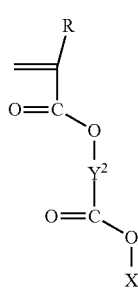 (II-1-06)

In the formulae, R represents a hydrogen atom, an alkyl group of 1 to 5 carbon atoms or a halogenated alkyl group of 1 to 5 carbon atoms; $R^{81}$ represents an alkyl group; $R^{82}$ represents a group which forms an aliphatic monocyclic group with the carbon atom to which $R^{82}$ is bonded; $R^{83}$ represents a branched alkyl group; $R^{84}$ represents a group which forms an aliphatic polycyclic group with the carbon atom to which $R^{84}$ is bonded; $R^{85}$ represents a linear alkyl group of 1 to 5 carbon atoms; $R^{15}$ and $R^{16}$ each independently represents an alkyl group; $Y^2$ represents a divalent linking group; and $X^2$ an acid dissociable group.

In the formulas, R, $Y^2$ and $X^2$ are the same as defined above.

In general formula (II-1-01), as the alkyl group for $R^{81}$, the same alkyl groups as those described above for $R^{14}$ in formulas (1-1) to (1-9) can be used, preferably a methyl group, an ethyl group or an isopropyl group.

As the aliphatic monocyclic group formed by $R^{82}$ and the carbon atoms to which $R^{82}$ is bonded, the same aliphatic cyclic groups as those described above for the aforementioned tertiary alkyl ester-type acid dissociable group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ether bond (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{82}$ constituting such an aliphatic cyclic group, an alkylene group which may have an ether bond (—O—) interposed between the carbon atoms can be given.

Specific examples of the compound represented by general formula (II-1-01) include compounds represented by the aforementioned formulae (II-1-1-16) to (II-1-1-23), (II-1-1-27) and (II-1-1-31). Among these, a compound represented by general formula (II-1-1-02) shown below which includes the compounds represented by the aforementioned formulae (II-1-1-16), (II-1-1-17), (II-1-1-20) to (II-1-1-23), (II-1-1-27), (II-1-1-31), (II-1-1-32) and (II-1-1-33) is preferable. Further, a structural unit represented by general formula (II-1-1-02') shown below is also preferable.

In the formulas, h represents an integer of 1 to 4, and preferably 1 or 2.

[Chemical Formula 25]

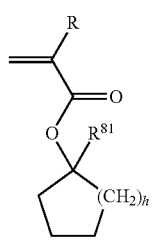 (II-1-1-02)

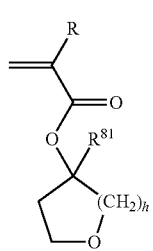 (II-1-1-02')

In the formulae, R and $R^{81}$ are the same as defined above; and h represents an integer of 1 to 4.

In general formula (II-1-02), as the branched alkyl group for $R^{83}$, the same alkyl groups as those described above for $R^{14}$ in formulas (1-1) to (1-9) which are branched can be used, and an isopropyl group is particularly desirable.

As the aliphatic polycyclic group formed by $R^{84}$ and the carbon atoms to which $R^{84}$ is bonded, the same aliphatic cyclic groups as those described above for the aforementioned tertiary alkyl ester-type acid dissociable group and which are polycyclic can be used.

Specific examples of the compound represented by general formula (II-1-02) include compounds represented by the aforementioned formulae (II-1-1-26) and (II-1-1-28) to (II-1-1-30).

As the compound represented by formula (II-1-02), a compound in which the aliphatic polycyclic group formed by $R^{84}$ and the carbon atom to which $R^{84}$ is bonded is a 2-adamantyl group is preferable, and a compound represented by the aforementioned formula (II-1-1-26) is particularly desirable.

In general formula (II-1-03), R and $R^{84}$ are the same as defined above.

As the linear alkyl group for $R^{85}$, the same linear alkyl groups as those described above for $R^{14}$ in the aforementioned formulas (1-1) to (1-9) can be mentioned, and a methyl group or an ethyl group is particularly desirable.

Specific examples of the compound represented by general formula (II-1-03) include compounds represented by the aforementioned formulae (II-1-1-1), (II-1-1-2) and (II-1-1-7) to (II-1-1-15).

As the compound represented by formula (II-1-03), a compound in which the aliphatic polycyclic group formed by $R^{84}$ and the carbon atom to which $R^{84}$ is bonded is a 2-adamantyl group is preferable, and a compound represented by the aforementioned formula (II-1-1-1) or (II-1-1-2) is particularly desirable. Further, a compound in which the aliphatic polycyclic group formed by $R^{84}$ and the carbon atom to which $R^{84}$ is bonded is a "group in which one or more hydrogen atoms have been removed from tetracyclododecane" is also preferable, and a compound represented by the aforementioned formula (II-1-1-8), (II-1-1-9) or (II-1-1-30) is also preferable.

In formula (II-1-04), R and $R^{82}$ are the same as defined above. $R^{15}$ and $R^{16}$ are the same as $R^{15}$ and $R^{16}$ in the aforementioned general formulae (2-1) to (2-6), respectively.

Specific examples of the compound represented by formula (II-1-04) include compounds represented by the aforementioned formulae (II-1-1-35) and (II-1-1-36) which were described above as specific examples of the compound represented by general formula (II-1-1).

In general formula (II-1-05), R and $R^{84}$ are the same as defined above. $R^{15}$ and $R^{16}$ are the same as $R^{15}$ and $R^{16}$ in the aforementioned general formulae (2-1) to (2-6), respectively.

Specific examples of the compound represented by formula (II-1-05) include compounds represented by the aforementioned formulae (II-1-1-4) to (II-1-1-6) and (II-1-1-34) which were described above as specific examples of the compound represented by general formula (II-1-1).

Examples of the compound represented by formula (II-1-06) include compounds represented by the aforementioned formulae (II-1-3) and (II-1-4), and a compound represented by the formula (II-1-3) is particularly desirable.

As a compound represented by formula (II-1-06), those in which $Y^2$ is a group represented by the aforementioned formula —$Y^{21}$—O—$Y^{22}$— or —$Y^{21}$—C(=O)—O—$Y^{22}$— is particularly desirable.

—Monomers (II-2), (II-3)

In the present specification, the monomer (II-2) is a compound in which at least a part of the hydrogen atom within the phenolic hydroxy group of hydroxystyrene or a derivative thereof is protected with a substituent containing an acid decomposable group.

Further, the monomer (II-3) is a compound in which at least a part of the hydrogen atom within —C(=O)—OH of vinylbenzoic acid or a derivative thereof is protected with a substituent containing an acid decomposable group.

In the monomers (II-2) and (II-3), as the substituent containing an acid decomposable group, the tertiary alkyl ester-type acid dissociable group and the acetal-type acid dissociable group described above for the monomer (II-1) can be given as preferable examples.

As the monomer containing an acid decomposable group which exhibits increased polarity by the action of acid used in the production method of the present invention, one type of compound may be used, or two or more types of compounds may be used in combination.

(Basic Compound)

The basic compound is not particularly limited as long as it is a protophilic compound, and any of the conventionally known compounds may be selected for use. Among the aforementioned polymerization initiators such as diazo polymerization initiators, some polymerization initiators are slightly basic. However, in the production method of the present invention, it is preferable that a basic compound having no polymerization initiating ability is present other than the polymerization initiator.

In the present invention, the basic compound may be either an aliphatic amine or an aromatic amine.

—Aliphatic Amine

An aliphatic amine is an amine having one or more aliphatic groups, and each aliphatic group preferably has 1 to 12 carbon atoms.

Examples of these aliphatic amines include amines in which at least one hydrogen atom of ammonia ($NH_3$) has been substituted with a chain-like alkyl group or hydroxyalkyl group of no more than 12 carbon atoms (i.e., alkylamines or alkylalcoholamines), and aliphatic cyclic amines.

Specific examples of alkylamines and alkylalcoholamines include monoalkylamines (primary alkylamines) such as n-hexylamine, n-heptylamine, n-octylamine, n-nonylamine, and n-decylamine; dialkylamines (secondary alkylamines) such as diethylamine, di-n-propylamine, di-n-heptylamine, di-n-octylamine, and dicyclohexylamine; trialkylamines (tertiary alkylamines) such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, tertiary alkylamines are preferable, a tertiary alkylamine of 2 to 10 carbon atoms is more preferable, and triethylamine, tri-n-pentylamine or tri-n-octylamine is more preferable.

Examples of the aliphatic cyclic amine include aliphatic heterocyclic compounds containing a nitrogen atom as a hetero atom. The aliphatic heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-

(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

—Aromatic Amine

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the basic compound used in the present invention, a heterocyclic amine or a tertiary alkylamine is preferable because such amine exhibits high solubility in a typically used polymerization solvent such as ethyl lactate, γ-butyrolactone, methyl ethyl ketone, propylene glycol monomethyl ether acetate or tetrahydrofuran. Among these, aniline, pyridine or triethylamine is more preferable, and triethylamine is most preferable.

Since a heterocyclic amine or a tertiary alkylamine is appropriately basic, the monomer is not decomposed in the synthesis, and such amine can be easily removed by an alcoholic washing solvent. Further, since a tertiary alkylamine such as triethylamine or a heterocyclic amine is a compound usable as a quencher in a general resist composition, such amine hardly affects the resist composition when used in the production of a polymeric compound for a resist composition.

In the case where the polymeric compound obtained by the present invention is used in a resist composition for use in lithography using ArF excimer laser as an exposure source, the basic compound is most preferably a tertiary amine. Since a tertiary amine exhibits excellent transparency to ArF excimer laser which has a wavelength of 193 nm, even when the tertiary amine remains in the resist composition, the lithography properties and sensitivity are hardly affected.

As the basic compound, one type of compound may be used, or two or more types of compounds may be used in combination.

(Polymeric Compound)

The polymeric compound produced by the method of the present invention includes a structural unit containing an —$SO_2$— containing cyclic group (hereafter, referred to as "structural unit (a0)") and a structural unit containing an acid decomposable group which exhibits increased polarity by the action of acid (hereafter, referred to as "structural unit (a1)").

In the production method of the polymeric compound, since the acid decomposable group within the structural unit (a1) derived from the "monomer containing an acid decomposable group which exhibits increased polarity by the action of acid" is not decomposed, the yield of the polymeric compound can be improved in the production method. Further, in the case where the polymeric compound is used in a resist composition, since the acid decomposable group is not decomposed, the dissolution contrast between exposed portions and unexposed portions can be improved when acid is generated from the acid generator or the like within the resist composition upon exposure, thereby improving the lithography properties of the obtained resist pattern and reducing defects.

The reason why these effects can be achieved has not been elucidated yet, but the following is presumed. In the production of a polymeric compound including structural units (a0) and (a1), it is presumed that the —$SO_2$— containing cyclic group within the structural unit (a0) itself or a substance derived from the cyclic group functions similarly to an "acid" in the polymerization solvent, thereby decomposing the acid decomposable group within the structural unit (a1) during the production of the polymeric compound. In the present invention, by conducting copolymerization of the monomers for deriving the structural units (a0) and (a1) in the presence of a basic compound, it is presumed that partial decomposition of the acid decomposable group by the monomer containing an —$SO_2$— containing cyclic group can be suppressed, thereby achieving the above-mentioned effects.

<<Resist Composition>>

The resist composition according to a second aspect of the present invention contains a polymeric compound produced by the production method according to the aforementioned first aspect, i.e., a polymeric compound including a structural unit (a0) containing an —$SO_2$— containing cyclic group and a structural unit (a1) containing an acid decomposable group which exhibits increased polarity by the action of acid.

The resist composition of the present invention preferably includes a base component (A) (hereafter, referred to as "component (A)") which exhibits changed solubility in a developing solution under action of acid, and an acid-generator component (B) (hereafter, referred to as "component (B)") which generates acid upon exposure. When a resist film is formed using the resist composition and the formed resist film is subjected to a selective exposure, acid is generated from the component (B) at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

<Component (A)>

As the component (A), an organic compound typically used as a base component for a chemically amplified resist composition can be used alone, or two or more of such organic compounds can be mixed together.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "resin" refers to a polymer having a molecular weight of 1,000 or more.

As the molecular weight of the polymer, the weight average molecular weight in terms of the polystyrene equivalent value determined by gel permeation chromatography (GPC) is used.

The component (A) may be a resin that exhibits increased solubility in a developing solution under action of acid or a resin that exhibits decreased solubility in a developing solution under action of acid.

When the resist composition of the present invention is a resist composition that forms a negative-tone resist pattern in an alkali developing process (or a positive-tone resist pattern in a solvent developing process), as the component (A), a base component that is soluble in an alkali developing solution (hereafter, this base component is sometimes referred to as component "alkali-soluble base component") is preferably used, and a cross-linking component is further added. As the alkali-soluble base component, a resin (alkali-soluble resin) is generally used.

The alkali-soluble base component generally has an alkali-soluble group such as a hydroxy group, a carboxy group or an amino group. The cross-linking component used has a reactive group such as a methylol group or an alkoxymethyl group that reacts with the alkali-soluble group by the action of acid. When a resist film is formed using the resist composition and the formed resist film is subjected to a selective exposure, acid is generated from the component (B) at exposed portions, and the action of acid causes cross-linking between the alkali-soluble base component and the cross-linking component, thereby decreasing the number of alkali-soluble groups of the alkali-soluble base component and the polarity, and increasing the molecular weight. As a result, solubility in an alkali developing solution is decreased (solubility in an organic developing solution is increased). Therefore, in the formation of a resist pattern, by conducting selective exposure of a resist film formed by applying the resist composition to a substrate, the exposed portions become insoluble in an alkali developing solution (soluble in an organic developing solution), whereas the unexposed portions remain soluble in an alkali developing solution (insoluble in an organic developing solution), and hence, a negative resist pattern can be formed by conducting development using an alkali developing solution. On the other hand, when an organic developing solution is used as the developing solution, a positive resist pattern can be formed.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linker added is preferably within a range from 1 to 50 parts by weight, relative to 100 parts by weight of the alkali-soluble resin.

When alkali-soluble base component is self-crosslinkable (e.g., when the alkali-soluble base component has a group that reacts with an alkali-soluble group by the action of acid), the cross-linking component does not necessarily be added.

When the resist composition of the present invention is a resist composition that forms a positive-tone resist pattern in an alkali developing process and a negative-tone resist pattern in a solvent developing process, as the component (A), a polymeric compound that exhibits increased polarity by the action of acid (hereafter, this base component is sometimes referred to as "component (A0)") is preferably used. Since the polarity of the component (A0) is changed prior to and after exposure, by using the component (A0), an excellent development contrast can be achieved not only in an alkali developing process, but also in a solvent developing process.

More specifically, in the case of applying an alkali developing process, the component (A0) is substantially insoluble in an alkali developing solution prior to exposure, but when acid is generated from the component (13) upon exposure, the action of this acid causes an increase in the polarity of the base component, thereby increasing the solubility of the component (A0) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern can be formed by alkali developing. On the other hand, in the case of a solvent developing process, the component (A0) exhibits high solubility in an organic developing solution prior to exposure, and when acid is generated from the component (B) upon exposure, the polarity of the component (A-1) is increased by the action of the generated acid, thereby decreasing the solubility of the component (A-1) in an organic developing solution.

Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

In the present invention, the component (A) is preferably a component (A0). That is, the resist composition of the present invention is preferably a chemically amplified resist composition which becomes a positive type in the case of an alkali developing process, and a negative type in the case of a solvent developing process.

The component (A0) may be a resin component that exhibits increased polarity under the action of acid, a low molecular weight compound that exhibits increased polarity under the action of acid, or a mixture thereof.

As the component (A0), a resin component (A1) (hereafter, referred to as "component (A1)") which exhibits increased polarity by the action of acid is preferable.

[Component (A1)]

Specifically, as the component (A1), a polymeric compound including a structural unit (a1) containing an acid decomposable group that exhibits increased polarity by the action of acid is preferable, and a polymeric compound produced by the method of the present invention is most preferable. That is, the component (A1) preferably includes a structural unit (a0) containing an —$SO_2$— containing cyclic group and a structural unit (a1) containing an acid decomposable group which exhibits increased polarity by the action of acid.

The component (A1) preferably includes, in addition to the structural units (a0) and (a1), a structural unit (a2) derived from an acrylate ester which may have the hydrogen atom bonded to the carbon atom on the α-position substituted with a substituent and contains a lactone-containing cyclic group.

In addition to the structural units (a0) and (a1) or in addition to the structural units (a0), (a1) and (a2), it is preferable that the component (A1) further include a structural unit (a3) derived from an acrylate ester containing a polar group-containing aliphatic hydrocarbon group and may have the hydrogen atom bonded to the carbon atom on the α-position substituted with a substituent.

(Structural Unit (a0))

The structural unit (a0) is a structural unit containing an —SO$_2$— containing cyclic group and derived from the aforementioned "monomer containing an —SO$_2$— containing cyclic group". As the structural unit (a0), a structural unit in which an ethylenic double bond of the aforementioned monomer containing an —SO$_2$— containing cyclic group has been cleaved to be converted into a single bond is preferable, and a structural unit represented by formula (a0-1) shown below is particularly desirable.

[Chemical Formula 26]

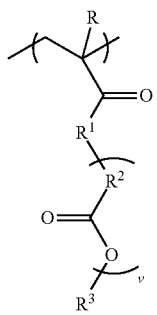

(a0-1)

In the formula, R, R$^1$, R$^2$, R$^3$ and v are the same as defined above.

Specifically, as the structural unit represented by the formula (a0-1), a structural unit derived from a compound represented by the aforementioned formula (I-1) or (I-2) is preferable, and a structural unit derived from a compound represented by any one of the aforementioned general formulae (I-21) to (I-24) is more preferable.

In the component (A1), as the structural unit (a0), one type of structural unit may be used alone, or two or more types of structural units may be used in combination.

In the component (A1), the amount of the structural unit (a0) based on the combined total of all structural units constituting the component (A1) is preferably 1 to 80 mol %, more preferably 10 to 70 mol %, still more preferably 10 to 65 mol %, and most preferably 15 to 50 mol %.

When the amount of the structural unit (a0) is no more than the upper limit of the above-mentioned range, the solubility in an organic solvent (the component (S) described later) is enhanced. On the other hand, when the amount of the structural unit (a0) is at least as large as the lower limit of the above-mentioned range, a pattern can be easily formed using a resist composition prepared from the component (A1), and various lithography properties such as resolution, LWR and the like are improved, and the resist pattern shape is improved.

(Structural Unit (a1))

The structural unit (a1) is a structural unit containing an acid decomposable group which exhibits increased polarity by the action of an acid and derived from the aforementioned "monomer containing an acid decomposable group which exhibits increased polarity by the action of an acid". As the structural unit (a1), a structural unit in which an ethylenic double bond of the aforementioned monomer containing an acid decomposable group which exhibits increased polarity by the action of an acid has been cleaved to be converted into a single bond is preferable, a structural unit derived from the aforementioned (α-substituted) acrylate ester monomer (II-1) containing an acid decomposable group which exhibits increased polarity by the action of an acid is more preferable, and a structural unit represented by formula (a1-0-1) or (a1-0-2) shown below is most preferable.

[Chemical Formula 27]

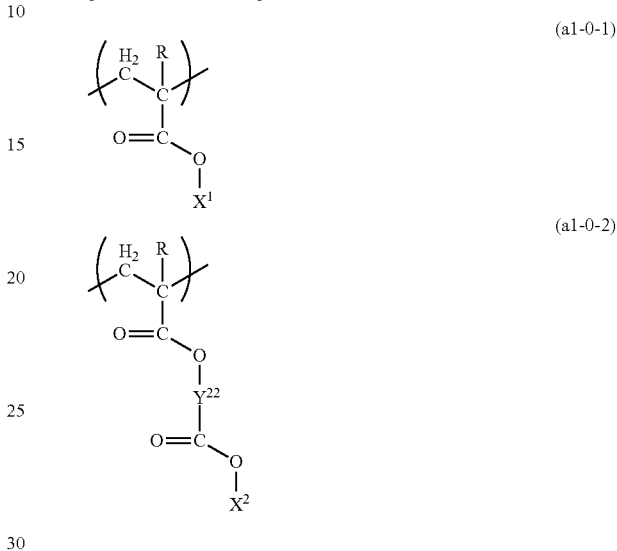

In the formulae, R, X$^1$, Y$^2$ and X$^2$ are the same as defined above.

Specific examples of the structural unit represented by the formula (a1-0-1) or (a1-0-2) shown below include a structural unit derived from a compound represented by any one of the aforementioned formulae (II-1-1) to (II-1-4); a structural unit derived from at least one compound selected from the group consisting of compounds represented by the aforementioned formulae (II-1-1-1) to (II-1-1-36), (II-1-2-1) to (II-1-2-24), (II-1-3-1) to (II-1-3-32) and (II-1-4-1) to (II-1-4-15); and a structural unit derived from at least one compound selected from the group consisting of compounds represented by the aforementioned formulae (II-1-01) to (II-1-06).

In the component (A1), as the structural unit (a1), one type of structural unit may be used, or two or more types may be used in combination.

In the component (A1), the amount of the structural unit (a1) based on the combined total of all structural units constituting the component (A1) is preferably 15 to 70 mol %, more preferably 15 to 60 mol %, and still more preferably 20 to 55 mol %.

When the amount of the structural unit (a1) is at least as large as the lower limit of the above-mentioned range, a pattern can be easily formed using a resist composition prepared from the component (A1), and various lithography properties such as sensitivity, resolution, LWR and the like are improved. On the other hand, when the amount of the structural unit (a1) is no more than the upper limit of the above-mentioned range, a good balance can be reliably achieved with the other structural units.

(Structural Unit (a2))

The structural unit (a2) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including one ring containing a —O—C (=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water (especially in an alkali developing process).

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 28]

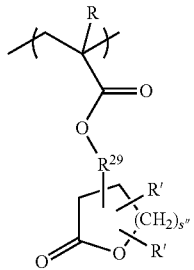

(a2-1)

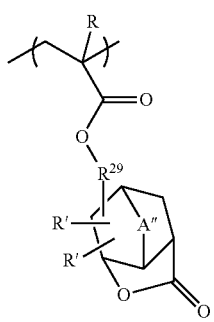

(a2-2)

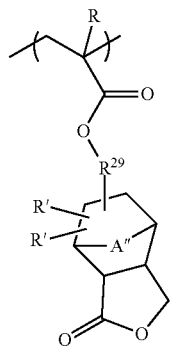

(a2-3)

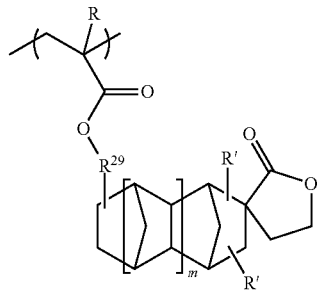

(a2-4)

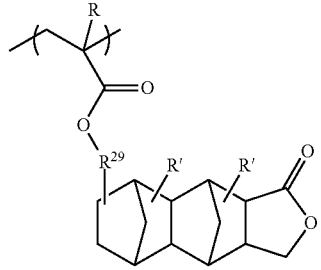

(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group, an alkoxy group, a halogen atom, a halogenated alkyl group, a hydroxy group, an oxygen atom (=O), —COOR", OC(=O)R", a hydroxyalkyl group or a cyano group, wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a0-1).

As the alkyl group, alkoxy group, halogen atom, halogenated alkyl group, —COOR", —OC(=O)R" and hydroxyalkyl group for R', the same alkyl groups, alkoxy groups, halogen atoms, halogenated alkyl groups, —COOR", —OC(=O)R" and hydroxyalkyl groups as those described above as the substituent for the —SO$_2$— containing cyclic group can be mentioned.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $R^1$ in general formula (a0-1). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $R^1$.

s" is preferably 1 or 2.

Specific examples of structural units represented by general formulas (a2-1) to (a2-5) are shown below.

In the formulae shown below, $R^\alpha$ represents a hydrogen atom, a methyl group or a trifluoromethyl group.

[Chemical Formula 29]

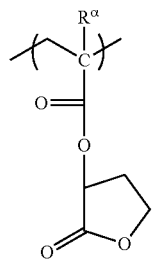
(a2-1-1)

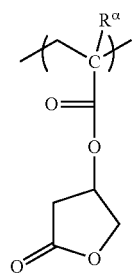
(a2-1-2)

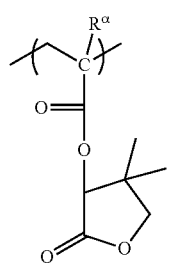
(a2-1-3)

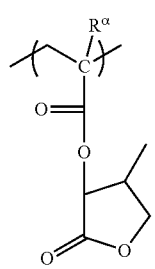
(a2-1-4)

-continued

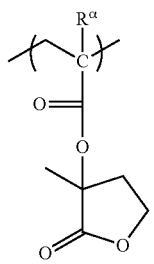
(a2-1-5)

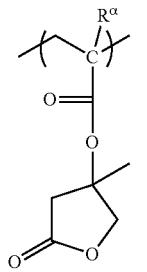
(a2-1-6)

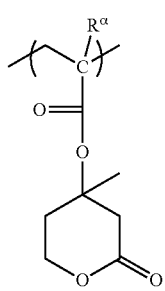
(a2-1-7)

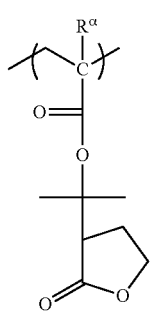
(a2-1-8)

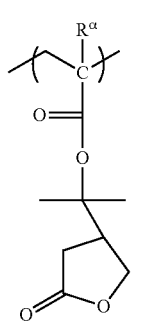
(a2-1-9)

-continued
(a2-1-10)
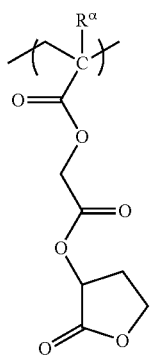
(a2-1-11)
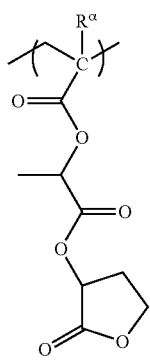
(a2-1-12)
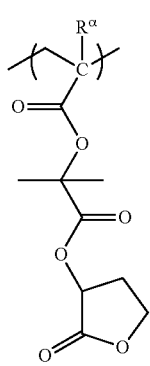
(a2-1-13)
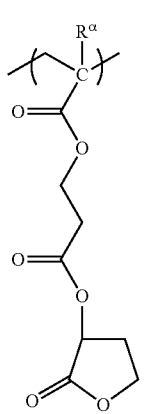
-continued
[Chemical Formula 30]
(a2-2-1)
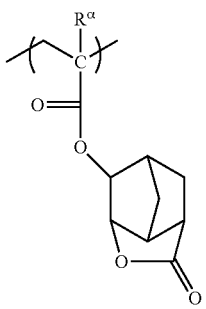
(a2-2-2)
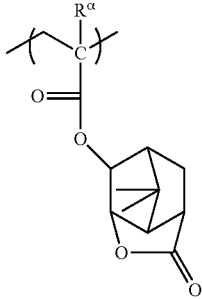
(a2-2-3)
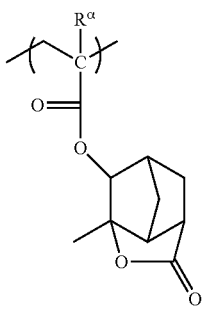
(a2-2-4)
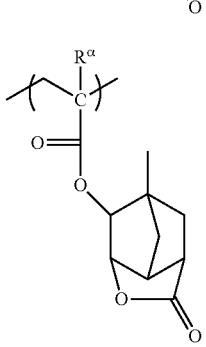
(a2-2-5)
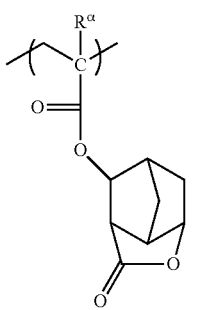

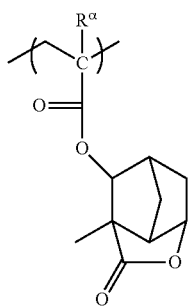 (a2-2-6)
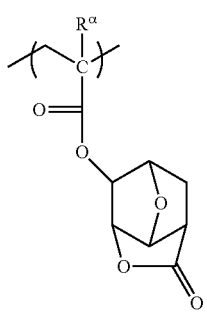 (a2-2-7)
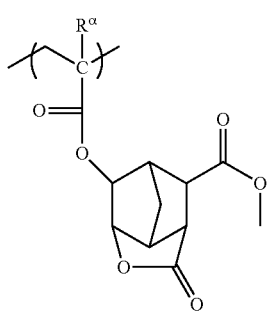 (a2-2-8)
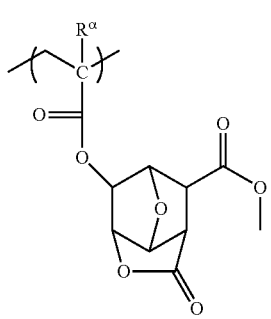 (a2-2-9)
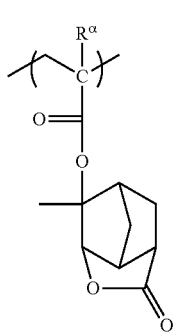 (a2-2-10)
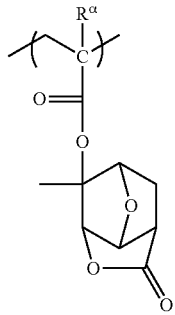 (a2-2-11)
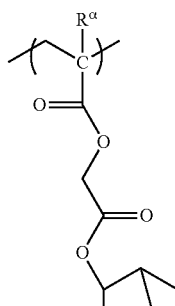 (a2-2-12)
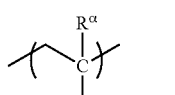 (a2-2-13)
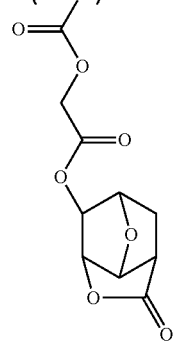 (a2-2-14)

(a2-2-15)
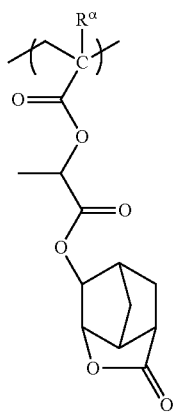
(a2-2-16)
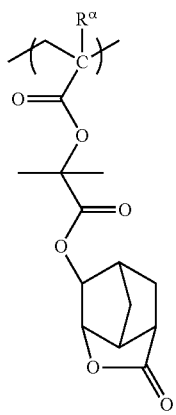
(a2-2-17)
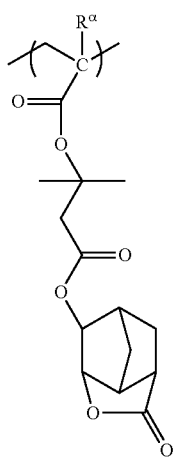
[Chemical Formula 31]
(a2-3-1)
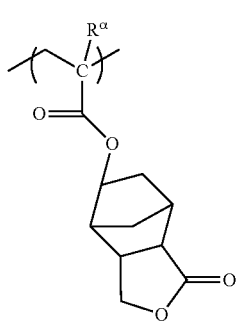
(a2-3-2)
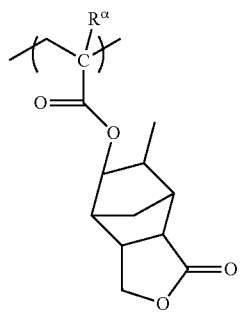
(a2-3-3)
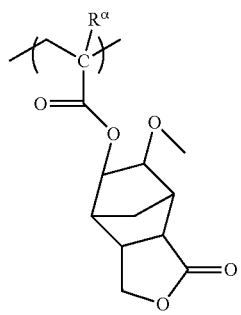
(a2-3-4)
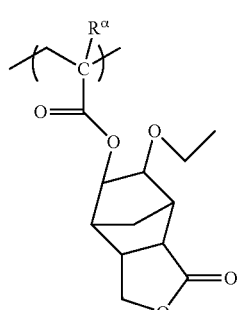
(a2-3-5)
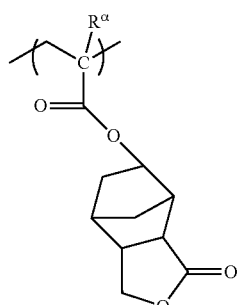
[Chemical Formula 32]
(a2-4-1)
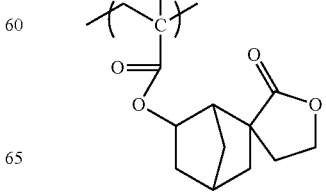

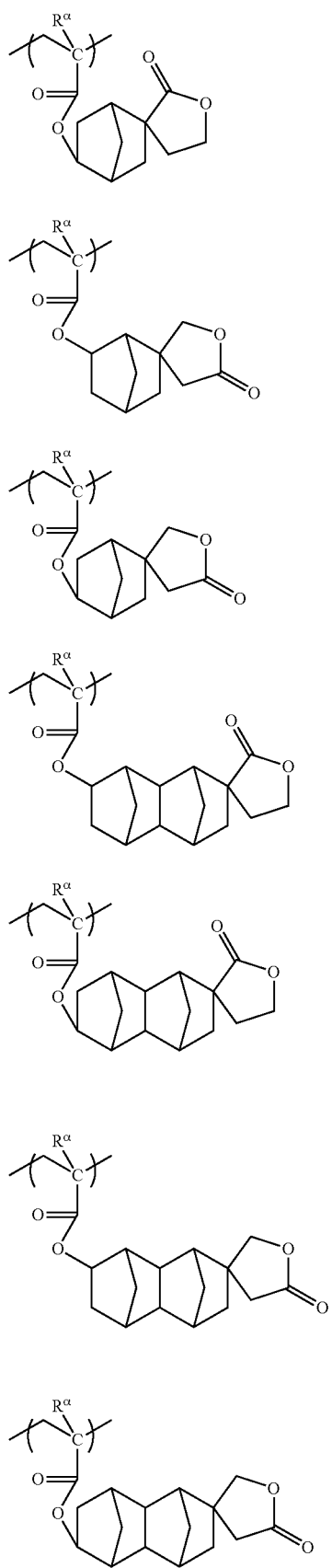
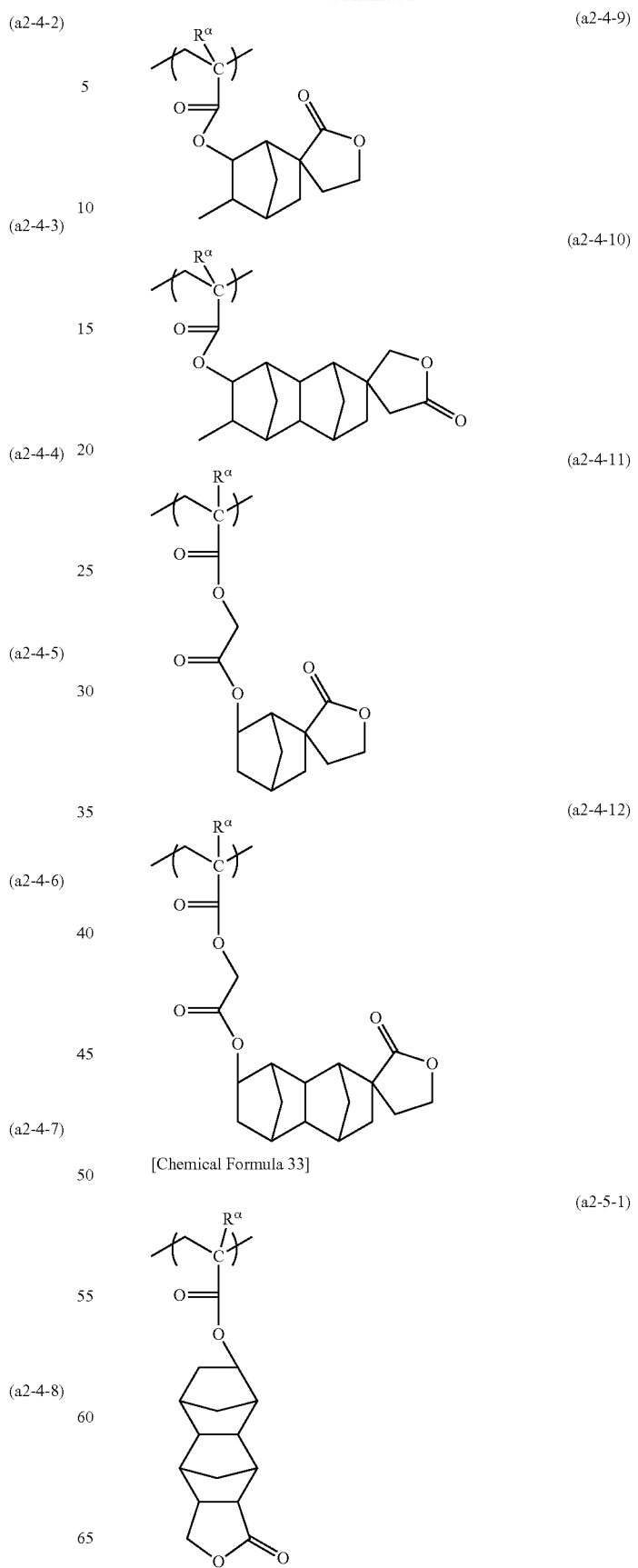
[Chemical Formula 33]

(a2-5-2) 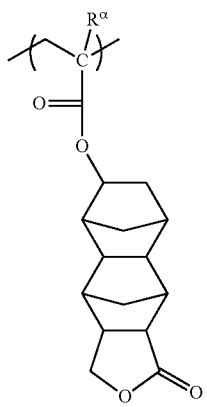

(a2-5-3) 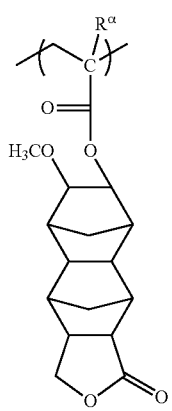

(a2-5-4) 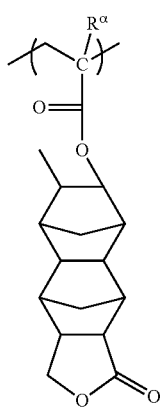

(a2-5-5) 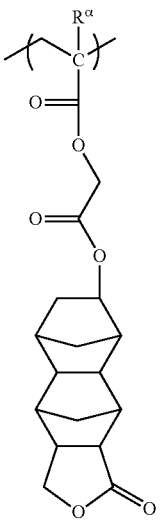

(a2-5-6) 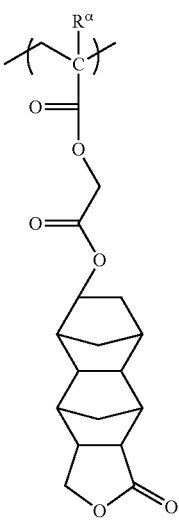

When the component (A1) includes a structural unit (a2), as the structural unit (a2), one type of structural unit may be used, or two or more types may be used.

As the structural unit (a2), at least one structural unit selected from the group consisting of formulas (a2-1) to (a2-5) is preferable, and at least one structural unit selected from the group consisting of formulas (a2-1) to (a2-3) is more preferable. Of these, it is preferable to use at least one structural unit selected from the group consisting of structural units represented by formulas (a2-1-1), (a2-1-2), (a2-2-1), (a2-2-7), (a2-3-1) and (a2-3-5).

When the component (A1) includes the structural unit (a2), the amount of the structural unit (a2) based on the combined total of all structural units constituting the component (A1) is preferably 5 to 60 mol %, more preferably 10 to 50 mol %, and still more preferably 10 to 45 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

(Structural Unit (a3))

The structural unit (a3) is a structural unit derived from an acrylate ester which may have the hydrogen atom bonded to the carbon atom on the α-position substituted with a substituent and contains a polar group-containing aliphatic hydrocarbon group (provided that the aforementioned structural units (A), (a1) and (a2) are excluded from the structural unit (a3)).

When the component (A1) includes the structural unit (a3), the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable. These polar groups are bonded to the aliphatic hydrocarbon group.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 34]

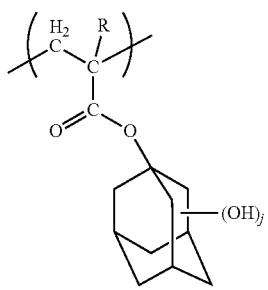
(a3-1)

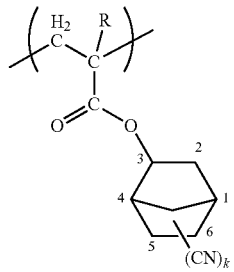
(a3-2)

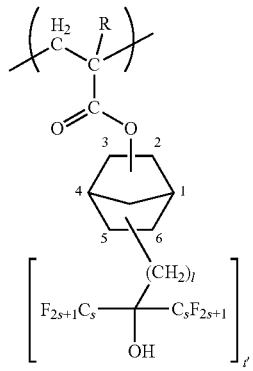
(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

[Other Structural Unit]

The component (A1) may also have a structural unit other than the above-mentioned structural units (a1), (a0), (a2) and (a3), as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of the other structural unit include a structural unit (a4) derived from an acrylate ester which may have the hydrogen atom bonded to the carbon atom on the α-position substituted with a substituent and contains an acid non-dissociable aliphatic polycyclic group, a structural unit (a5) derived from hydroxystyrene and a structural unit (a6) derived from styrene.

A "structural unit derived from a hydroxystyrene" refers to a structural unit that is formed by the cleavage of the ethylenic double bond of a hydroxystyrene.

A "structural unit derived from styrene" refers to a structural unit that is formed by the cleavage of the ethylenic double bond of styrene.

(Structural Unit (a4))

The structural unit (a4) is a structural unit derived from an acrylate ester which may have the hydrogen atom bonded to the carbon atom on the α-position substituted with a substituent and contains an acid non-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 35]

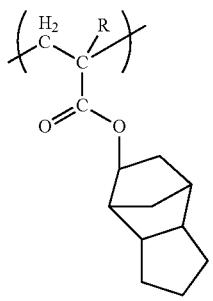

(a4-1)

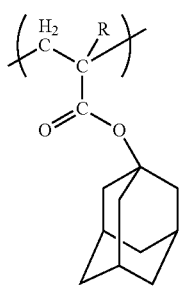

(a4-2)

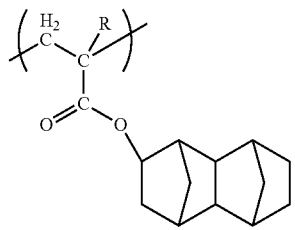

(a4-3)

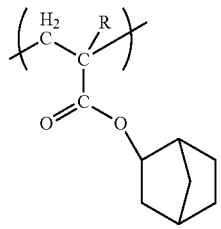

(a4-4)

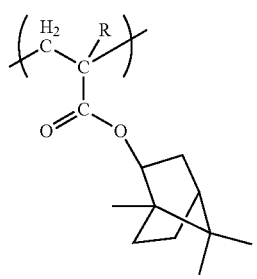

(a4-5)

In the formulae, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a5))

As the structural unit (a5), a structural unit represented by general formula (a5-1) shown below is preferable because the solubility in an organic solvent becomes excellent, the solubility in an alkali developing solution is increased, and the etching resistance becomes excellent.

[Chemical Formula 36]

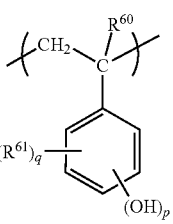

(a5-1)

In the formula, $R^{60}$ represents a hydrogen atom or an alkyl group of 1 to 5 carbon atoms; $R^{61}$ represents an alkyl group of 1 to 5 carbon atoms; p represents an integer of 1 to 3; and q represents an integer of 0 to 2.

In the formula (a5-1), specific examples of the alkyl group of 1 to 5 carbon atoms for $R^{60}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. As $R^{60}$, a hydrogen atom or a methyl group is preferable.

p represents an integer of 1 to 3, and is preferably 1.

The bonding position of the hydroxy group may be any of the o-position, m-position and p-position of the phenyl group. When p is 1, the p-position is preferable in terms of availability and low cost. When p is 2 or 3, a desired combination of the bonding positions can be used.

q represents an integer of 0 to 2. q is preferably 0 or 1, and most preferably 0 from industrial viewpoint.

As the alkyl group for $R^{61}$, the same alkyl groups as those for $R^{60}$ can be mentioned.

When q is 1, the bonding position of $R^{61}$ may be any of the o-position, the m-position and the p-position.

When q is 2, a desired combination of the bonding positions can be used. Here, the plurality of the $R^{61}$ group may be the same or different from each other.

When the structural unit (a5) is included in the component (A1), the amount of the structural unit (a5) based on the combined total of all the structural units that constitute the component (A1) is preferably within the range from 50 to 90 mol %, more preferably from 55 to 85 mol %, and still more preferably 60 to 80 mol %.

(Structural Unit (a6))

As the structural unit (a6), a structural unit represented by general formula (a6-1) shown below is preferable because the solubility in an alkali developing solution can be adjusted, and heat resistance and dry etching resistance are improved.

[Chemical Formula 37]

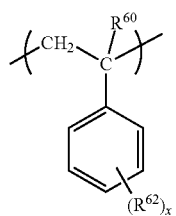

(a6-1)

In the formula, $R^{60}$ represents a hydrogen atom or an alkyl group of 1 to 5 carbon atoms; $R^{62}$ represents an alkyl group of 1 to 5 carbon atoms; and x represents an integer of 0 to 3.

In general formula (a6-1), $R^{60}$ is the same as defined above for $R^{60}$ in the aforementioned general formula (a5-1).

In the formula (a6-1), as the alkyl group for $R^{62}$, the same alkyl groups as those for $R^{61}$ in the aforementioned formula (a5-1) can be mentioned.

x represents an integer of 0 to 3, preferably 0 or 1, and most preferably 0 in terms of industry.

When x represents 1, the substitution position of $R^{62}$ may be any of o-position, m-position or p-position of the phenyl group. When x is 2 or 3, a desired combination of the bonding positions can be used. Here, the plurality of the $R^{62}$ group may be the same or different from each other.

When the structural unit (a6) is included in the component (A1), the amount of the structural unit (a6) based on the combined total of all the structural units that constitute the component (A1) is preferably within the range from 10 to 50 mol %, more preferably from 15 to 45 mol %, and still more preferably 20 to 40 mol %.

In the resist composition of the present invention, the component (A) preferably contains a resin component (A1) having the aforementioned structural units (a0) and (a1).

Specific examples of the component (A1) include a polymeric compound consisting of a structural unit (a0), a structural unit (a1) and a structural unit (a2); a polymeric compound consisting of a structural unit (a0), a structural unit (a1) and a structural unit (a3); a polymeric compound consisting of a structural unit (a1), a structural unit (a0) and a structural unit (a3); and a polymeric compound consisting of a structural unit (a0), a structural unit (a1), a structural unit (a2) and a structural unit (a3).

More specifically, preferable examples of the component (A1) include a polymeric compound consisting of a structural unit represented by the aforementioned formula (a0-1), a structural unit represented by the aforementioned formula (a1-0-1), a structural unit represented by the aforementioned formula (a2-1) and a structural unit represented by the aforementioned formula (a3-1); a polymeric compound consisting of a structural unit represented by the aforementioned formula (a0-1), a structural unit represented by the aforementioned formula (a1-0-1) and a structural unit represented by the aforementioned formula (a3-1); and a polymeric compound consisting of a structural unit represented by the aforementioned formula (a0-1) and a structural unit represented by the aforementioned formula (a1-0-1).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,500 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (A1) is not particularly limited, but is preferably 1.0 to 5.0, more preferably 1.0 to 3.0, and most preferably 1.2 to 2.5.

Here, Mn is the number average molecular weight.

In the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and most preferably 100% by weight. When the amount of the component (A1) is 25% by weight or more, the effects of the present invention are further improved.

In the component (A), as the component (A1), one type may be used, or two or more types of compounds may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

[Component (A2)]

In the resist composition of the present invention, the component (A) may contain "a base component which exhibits changed solubility in a developing solution under action of acid" other than the component (A1) (hereafter, referred to as "component (A2)").

As the component (A2), it is preferable to use a compound that has a molecular weight of at least 500 and less than 2,500, contains a hydrophilic group, and also contains an acid dissociable group described above in connection with the component (A1).

Specific examples include compounds containing a plurality of phenol skeletons in which a part of the hydrogen atoms within hydroxyl groups have been substituted with the aforementioned acid dissociable groups.

Examples of the component (A2) include low molecular weight phenolic compounds in which a portion of the hydroxyl group hydrogen atoms have been substituted with an aforementioned acid dissociable group, and these types of compounds are known, for example, as heat resistance improvers.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane skeletons is preferable in terms of resolution and LWR.

Also, there are no particular limitations on the acid dissociable group, and suitable examples include the groups described above.

As the component (A2), one type of resin may be used, or two or more types of resins may be used in combination.

In the resist composition of the present invention, as the component (A), one type may be used, or two or more types of compounds may be used in combination.

Of the examples shown above, as the component (A), it is preferable to use one containing the component (A1).

In the resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 38]

In the formulas above, $R^{1\prime\prime}$ to $R^{3\prime\prime}$, $R^{5\prime\prime}$ and $R^{6\prime\prime}$ each independently represent an aryl group or alkyl group, wherein two of $R^{1\prime\prime}$ to $R^{3\prime\prime}$ may be bonded to each other to form a ring with the sulfur atom; and $R^{4\prime\prime}$ represents an alkyl group, a halogenated alkyl group, an aryl group or an alkenyl group which may have a substituent, provided that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1\prime\prime}$ to $R^{3\prime\prime}$ in formula (b-1) are bonded to each other to form a ring with the sulfur atom, it is preferable that the two of R[1]''' to R[3]''' form a 3 to 10-membered ring including the sulfur atom, and it is particularly desirable that the two of R[1]''' to R[3]''' form a 5 to 7-membered ring including the sulfur atom.

When two of R[1]''' to R[3]''' in formula (b-1) are bonded to each other to form a ring with the sulfur atom, the remaining one of R[1]''' to R[3]''' is preferably an aryl group. As examples of the aryl group, the same as the above-mentioned aryl groups for R[1]''' to R[3]''' can be given.

As preferable examples of the cation moiety for the compound represented by general formula (b-1), those represented by formulas (I-1-1) to (I-1-11) shown below can be given. Among these, a cation moiety having a triphenylmethane skeleton, such as a cation moiety represented by any one of formulas (I-1-1) to (I-1-9) shown below is particularly desirable.

In formulas (I-1-10) and (I-1-11), each of $R^9$ and $R^{10}$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 39]

(I-1-1)

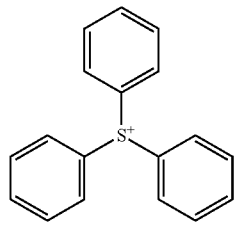

(I-1-2)

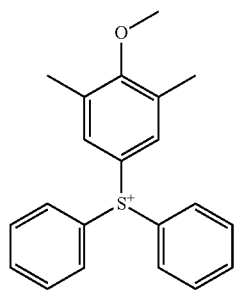

(I-1-3)

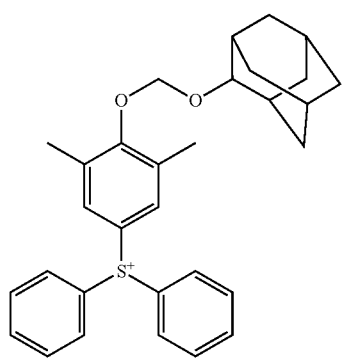

-continued (I-1-4)

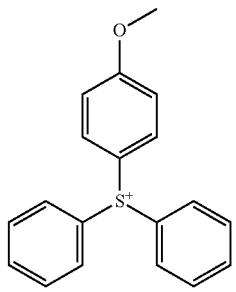

(I-1-5)

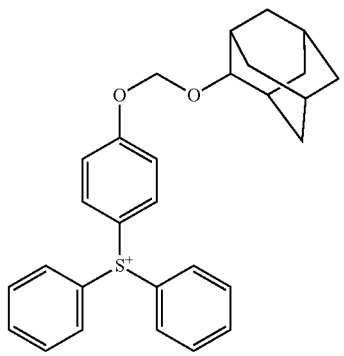

(I-1-6)

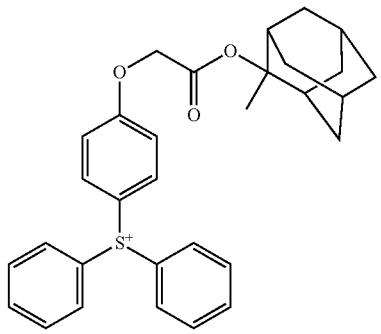

(I-1-7)

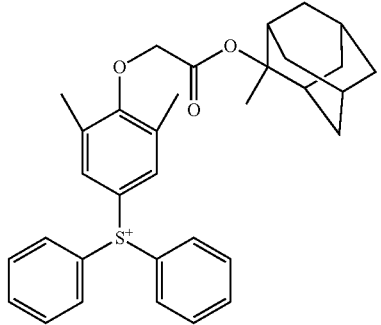

(I-1-8)

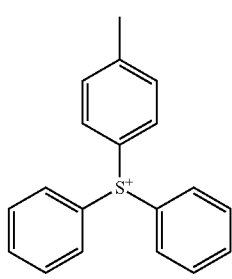

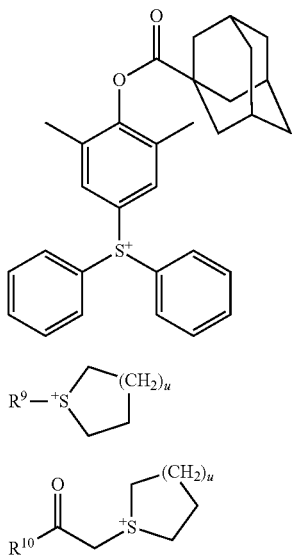

(I-1-9)

(I-1-10)

(I-1-11)

$R^{4\prime\prime\prime}$ represents an alkyl group, a halogenated alkyl group, an aryl group or an alkenyl group which may have a substituent.

The alkyl group for $R^{4\prime\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4\prime\prime\prime}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4\prime\prime\prime}$ is preferably an aryl group of 6 to 20 carbon atoms.

The alkenyl group for $R^{4\prime\prime\prime}$ is preferably an alkenyl group of 2 to 10 carbon atoms.

With respect to $R^{4\prime\prime\prime}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4\prime\prime\prime}$ may have one substituent, or two or more substituents.

Examples of the substituent include a halogen atom, a hetero atom, an alkyl group, and a group represented by the formula X-Q¹- (in the formula, Q¹ represents a divalent linking group containing an oxygen atom; and X represents a hydrocarbon group of 3 to 30 carbon atoms which may have a substituent).

Examples of halogen atoms and alkyl groups as substituents for $R^{4\prime\prime\prime}$ include the same halogen atoms and alkyl groups as those described above with respect to the halogenated alkyl group for $R^{4\prime\prime\prime}$.

Examples of hetero atoms include an oxygen atom, a nitrogen atom, and a sulfur atom.

In the group represented by formula X-Q'-, Q' represents a divalent linking group containing an oxygen atom.

Q' may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —R⁹¹—O—, —R⁹²—O—C(=O)—, —C(=O)—O—R⁹³—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—CH₂—]; alkylmethylene groups such as —CH(CH₃)—, —CH(CH₂CH₃)—, —C(CH₃)₂—, —C(CH₃)(CH₂CH₃)—, —C(CH₃)(CH₂CH₂CH₃)— and —C(CH₂CH₃)₂—; an ethylene group [—CH₂CH₂—]; alkylethylene groups such as —CH(CH₃)CH₂—, —CH(CH₃)CH(CH₃)—, —C(CH₃)₂CH₂— and —CH(CH₂CH₃)CH₂—; a trimethylene group (n-propylene group) [—CH₂CH₂CH₂—]; alkyltrimethylene groups such as —CH(CH₃)CH₂CH₂— and —CH₂CH(CH₃)CH₂—; a tetramethylene group [—CH₂CH₂CH₂CH₂—]; alkyltetramethylene groups such as —CH(CH₃)CH₂CH₂CH₂— and —CH₂CH(CH₃)CH₂CH₂—; and a pentamethylene group [—CH₂CH₂CH₂CH₂CH₂—].

$Q^1$ is preferably a divalent linking group containing an ester linkage or ether linkage, and more preferably a group of —R⁹¹—O—, —R⁹²—O—C(=O)— or —C(=O)—O—R⁹³—O—C(=O)—.

In the group represented by the formula X-Q¹-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 40]

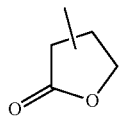
(L1)

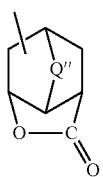
(L2)

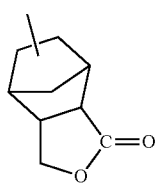
(L3)

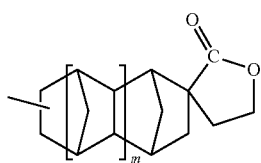
(L4)

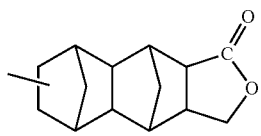
(L5)

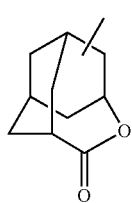
(L6)

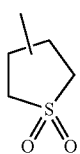
(S1)

-continued

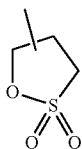
(S2)

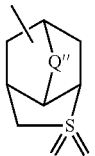
(S3)

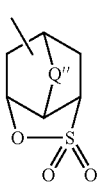
(S4)

In the formula, Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

As the alkylene group for R$^{94}$ and R$^{95}$, the same alkylene groups as those described above for R$^{91}$ to R$^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the aforementioned formulas (L2) to (L6), (S3) and (S4) are preferable.

In the present invention, R$^{4″}$ preferably has X-Q$^1$- as a substituent. In such a case, R$^{4″}$ is preferably a group represented by the formula X-Q$^1$-Y$^1$— (in the formula, Q$^1$ and X are the same as defined above; and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, as the alkylene group for Y$^1$, the same alkylene group as those described above for Q$^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), R$^{5\prime\prime\prime}$ and R$^{6\prime\prime\prime}$ each independently represent an aryl group or alkyl group. At least one of R$^{5\prime\prime\prime}$ and R$^{6\prime\prime\prime}$ represents an aryl group. It is preferable that both of R$^{5\prime\prime\prime}$ and R$^{6\prime\prime\prime}$ represent an aryl group.

As the aryl group for R$^{5\prime\prime\prime}$ and R$^{6\prime\prime\prime}$, the same aryl groups as those described above for R$^{1\prime\prime\prime}$ to R$^{3\prime\prime\prime}$ can be used.

As the alkyl group for R$^{5\prime\prime\prime}$ and R$^{6\prime\prime\prime}$, the same alkyl groups as those described above for R$^{1\prime\prime\prime}$ to R$^{3\prime\prime\prime}$ can be used.

It is particularly desirable that both of R$^{5\prime\prime\prime}$ and R$^{6\prime\prime\prime}$ represents a phenyl group.

As R$^{4\prime\prime\prime}$ in formula (b-2), the same groups as those mentioned above for R$^{4\prime\prime\prime}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

Furthermore, onium salts in which the anion moiety of these onium salts are replaced by an anion moiety represented by any one of formulas (b1) to (b8) shown below can be used.

[Chemical Formula 41]

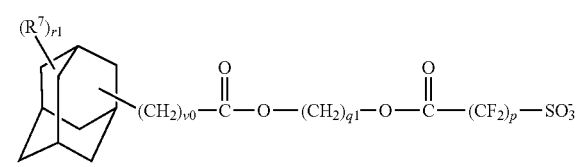

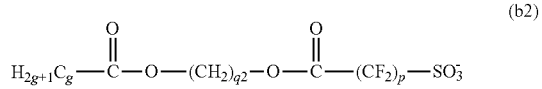

-continued

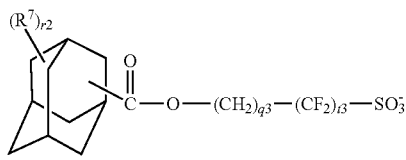
(b3)

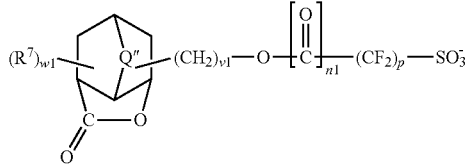
(b4)

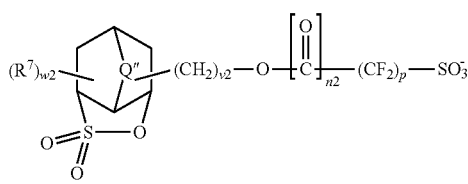
(b5)

[Chemical Formula 42]

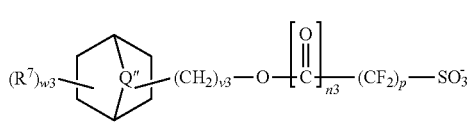
(b6)

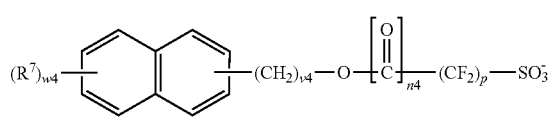
(b7)

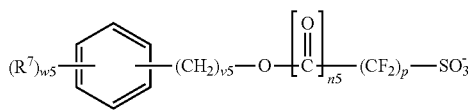
(b8)

In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; and Q″ is the same as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1, r2, and w1 to w5, then the two or more of the $R^7$ groups may be the same or different from each other.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 43]

(b-3)

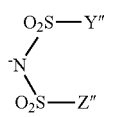
(b-4)

In the formulas, X″ represents an alkylene group of 2 to 6 carbon atoms in which at least one hydrogen atom has been substituted with a fluorine atom; and each of Y″ and Z″ independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y″ and Z″ independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X″ or those of the alkyl group for Y″ and Z″ within the above-mentioned range of the number of carbon atoms, the more the solubility in a resist solvent is improved.

Further, in the alkylene group for X″ or the alkyl group for Y″ and it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 44]

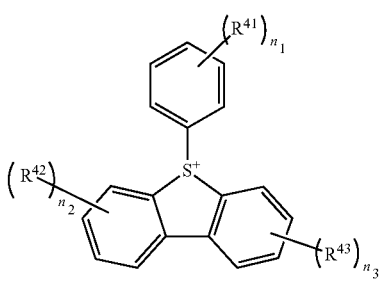
(b-5)

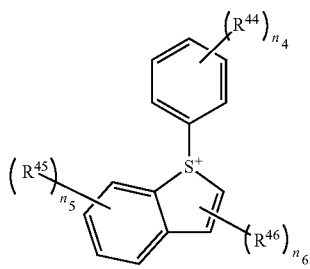

(b-6)

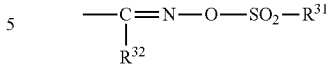

(B-1)

In formulas (b-5) and (b-6) above, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_5$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4"}SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation. Such oxime-sulfonate acid generators are widely used for a chemically amplified resist composition, and can be appropriately selected.

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 46]

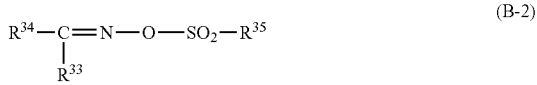

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 47]

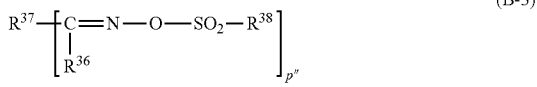

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyl oxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 86) may be preferably used.

Furthermore, as preferable examples, the following can be used.

[Chemical Formula 48]

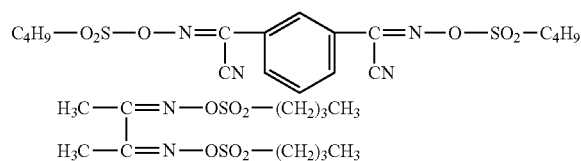

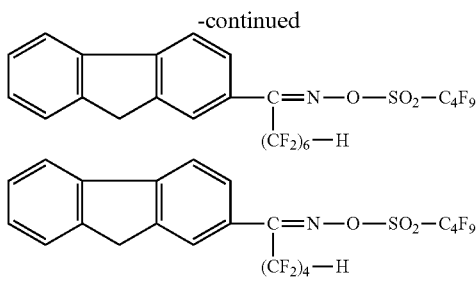

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the present invention, as the component (B), it is preferable to use an onium salt having a fluorinated alkylsulfonic acid ion as the anion moiety.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>
[Component (D)]

The resist composition of the present invention may contain a nitrogen-containing organic compound (D) (hereafter, referred to as "component (D)") which does not fall under the category of the component (A) and the component (B), as long as the effects of the present invention are not impaired.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Examples thereof include an aliphatic amine and an aromatic amine. Among these, an aliphatic amine is preferable, and a secondary aliphatic amine or tertiary aliphatic amine is particularly desirable.

An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of 1 to 20 carbon atoms (i.e., alkylamines or alkylalcoholamines), and cyclic amines.

The alkyl group and the alkyl group within the hydroxyalkyl group may be any of linear, branched or cyclic.

When the alkyl group is linear or branched, the alkyl group preferably has 2 to 20 carbon atoms, and more preferably 2 to 8 carbon atoms.

When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be monocyclic or polycyclic. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Specific examples of the polycycloalkane include adamantane, norbornane, isobornane, tricyclodecane and tetracyclododecane.

Specific examples of alkylamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine.

Specific examples of alkylalcoholamines include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

<Component (E)>

Furthermore, in the resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phenylphosphinic acid and phosphinic acid esters.

As the component (E), one type may be used alone, or two or more types may be used in combination.

As the component (E), an organic carboxylic acid is preferred, and salicylic acid is particularly desirable.

The component (E) is typically used in an amount within a range from 0.01 to 5.0 parts by weight, relative to 100 parts by weight of the component (A).

[Component (F)]

In the present invention, the resist composition may further include a fluorine additive (hereafter, referred to as "component (F)") for imparting water repellency to the resist film. By further including the component (F), the hydrophobicity of the surface of the resist film improves, thereby suppressing generation of defects after development.

As the component (F), for example, a fluorine-containing polymeric compound described in Japanese Unexamined Patent Application, First Publication No. 2010-002870 can be used.

Specific examples of the component (F) include polymers having a structural unit represented by general formula (f1) shown below. More specifically, as the component (F), a polymer (homopolymer) consisting of a structural unit represented by formula (f1) shown below; a copolymer of a structural unit represented by formula (f1) shown below and the aforementioned structural unit (a1); and a copolymer of a structural unit represented by the formula (f1) shown below, a structural unit derived from acrylic acid or methacrylic acid and the aforementioned structural unit (a1) are preferable.

Among the structural unit (a1), a structural unit derived from a compound represented by the aforementioned formula (a1-1-32) is most preferable.

[Chemical Formula 49]

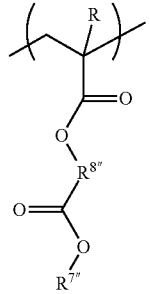

In the formula, R represents a hydrogen atom, an alkyl group of 1 to 5 carbon atoms or a halogenated alkyl group of 1 to 5 carbon atoms; $R^{7"}$ represents an organic group containing a fluorine atom; and $R^{8"}$ represents a alkylene group of 1 to 5 carbon atoms which may have a substituent.

In the aforementioned formula (f1), $R^{7"}$ represents an organic group containing a fluorine atom, and is preferably a hydrocarbon group containing a fluorine atom. As the hydrocarbon group containing a fluorine atom, a fluorinated alkyl group is preferable, and a fluorinated alkyl group of 1 to 5 carbon atoms is more preferable. Among these examples, as $R^{7"}$, a group represented by the formula: "—$(CH_2)o$—$CF_3$" is preferable (in the formula, o represents the repeating numbers of $CH_2$, and is an integer of 1 to 3).

In formula (f1), $R^{8"}$ represents an alkylene group of 1 to 5 carbon atoms, preferably 1 to 3, and more preferably 1 or 2. The hydrogen atom of the alkylene group for $R^{8"}$ may be substituted with a fluorine atom, an alkyl group of 1 to 5 carbon atoms or a fluorinated alkyl group of 1 to 5 carbon atoms.

In formula (f1), R is the same as defined above. As R, a hydrogen atom or a methyl group is preferable.

As the component (F), one type may be used alone, or two or more types may be used in combination.

In the resist composition, the component (F) is preferably used in an amount within a range from 1 to 10 parts by weight, relative to 100 parts by weight of the component (A). When the amount of the component (F) is within the above-mentioned range, the hydrophobicity of the surface of the resist film improves, thereby suppressing generation of defects after development.

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Component (S)>

The resist composition can be produced by dissolving the materials for the resist composition in an organic solvent (hereafter, referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

The component (S) can be used individually, or in combination as a mixed solvent.

Among these, γ-butyrolactone, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5. Furthermore, as the component (5), a mixed solvent of PGMEA and cyclohexanone, or a mixed solvent of PGMEA, PGME and cyclohexanone is also preferable. In such a case, the mixing ratio of the former in terms of weight ratio is preferably PGMEA:cyclohexanone=95-5:10-90, and the mixing ratio of the latter in terms of weight ratio is preferably PGMEA:PGME:cyclohexanone=35-55:20-40:15-35.

In the resist composition according to the second aspect of the present invention, by virtue of using a polymeric compound obtained by the production method according to the aforementioned first aspect, decomposition of the acid decomposable group by the monomer containing an —$SO_2$— containing cyclic group during the production of the polymeric compound can be suppressed. Therefore, the resist composition according to the second aspect exhibits excellent lithography properties, and is capable of reducing defects.

<<Method of Forming a Resist Pattern>>

Using the resist composition as described above, for example, a resist pattern can be formed by a method as described below.

Firstly, a resist composition of the present invention is applied to a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an electron lithography system or the like, the resist film is selectively exposed to an electron beam (EB) through a desired mask pattern, followed by post exposure bake (PEB) under temperature conditions of 80 to 150° C. for 40 to 120 seconds, preferably 60 to 90 seconds. Subsequently, an alkali developing solution such as a 0.1 to 10% by weight aqueous solution of tetramethylammonium hydroxide (TMAH) is used to perform an alkali developing treatment.

After the alkali developing treatment, it is preferable to conduct a rinse treatment. It is preferable to conduct a water rinse using pure water. Thereafter, drying is conducted. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used. These films may be provided as a monolayer, or a multilayer of two or more layers.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays.

The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air.

More specifically, in immersion lithography, the region between the resist film formed in the above-described manner and lens at the lowermost portion of the exposure apparatus is filled with a solvent (a immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

EXAMPLES

As follows is a description of examples of the present invention, although the scope of the present invention is by no way limited by these examples.

In the following examples, a compound represented by a chemical formula (1) is denoted "compound (1)", and the same applies for compounds represented by other formulae.

In the NMR analysis, the internal standard for $^1$H-NMR and $^{13}$C-NMR was tetramethylsilane.

Production Example 1

Production of Polymeric Compound (1-2)

7.93 g (46.64 mmol) of compound (1), 8.00 g (25.32 mmol) of compound (2), 11.17 g (42.64 mmol) of compound (3), 3.13 g (18.66 mmol) of compound (4), 3.46 g (14.66 mmol) of compound (5) and 0.064 g of triethylamine (0.025 mol % based on the compound (2); 800 ppm relative to the compound (2)) were dissolved in 50.54 g of methyl ethyl ketone (MEK). To the obtained solution was added and dissolved dimethyl 2,2'-azobis(isobutyrate) (product name: V-601, manufactured by Wako Pure Chemical Industries, Ltd.) in an amount of 13.3 mmol (9 mol %, relative to the fed monomers).

The resultant was dropwise added to 28.07 g of MEK heated to 76.5° C. in a nitrogen atmosphere over 3 hours. Thereafter, the reaction solution was heated for 4 hour while stirring (maturing), and then cooled to room temperature.

The resulting polymer solution was dropwise added to an n-hexane/2-propanol mixed solvent to thereby precipitate a polymer. Then, the precipitated white powder was subjected to filtration. Thereafter, the polymer was washed with a methanol mixed solvent, followed by filtration. Then, the methanol washing was repeated in the same manner. The polymer was separated by filtration and dried, thereby obtaining 21 g of a polymeric compound (1-2) as an objective compound (yield: 63%).

With respect to the polymeric compound (1-2), the weight average molecular weight (Mw) and the dispersity (Mw/Mn) were determined by the polystyrene equivalent value as measured by gel permeation chromatography (GPC). As a result, it was found that the weight average molecular weight was 6,800, and the dispersity was 1.64. Further, as a result of an analysis by carbon 13 nuclear magnetic resonance spectroscopy (600 MHz $^{13}$C-NMR), it was found that the composition of the copolymer (ratio (molar ratio) of the respective structural units within the structural formula) was l/m/n/o/p=34/21/17/15/13.

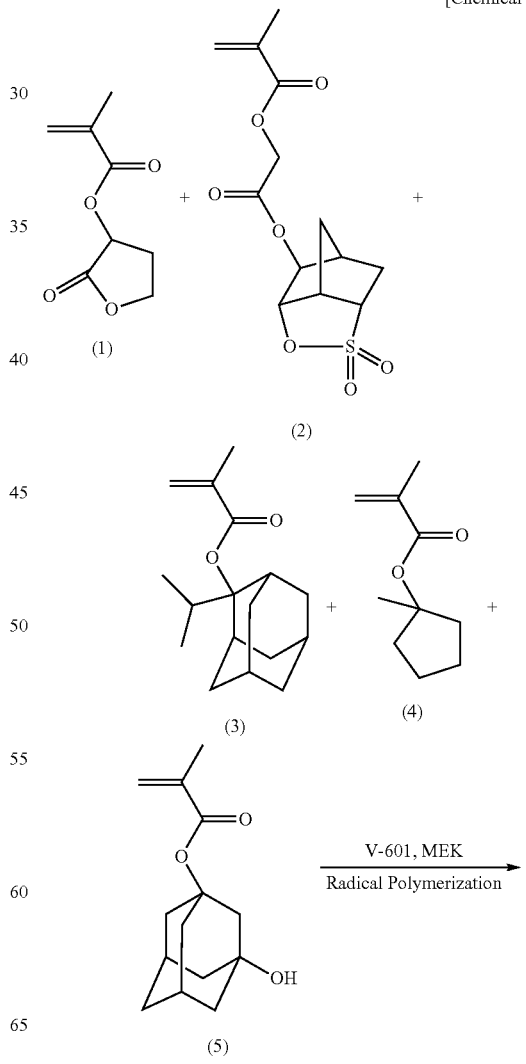

[Chemical Formula 50]

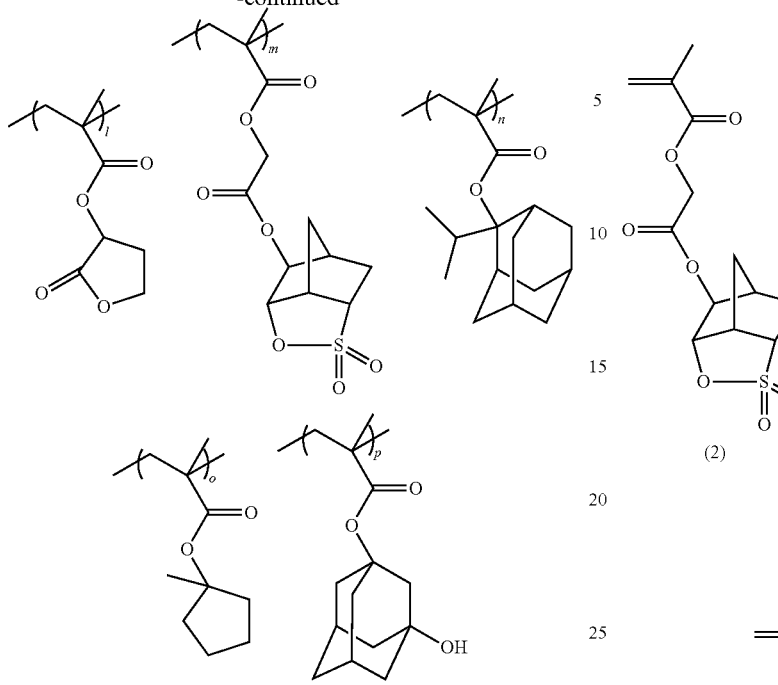

Polymeric compound (1-2)

Production Examples 2 and 3

Production of Polymeric Compounds (1-1) and (1-3)

Polymeric compounds (1-1) and (1-3) were produced in the same manner as in Production Example 1 (polymeric compound (1-2)), except that the amount of trimethylamine used was changed to 0.31 mol % and 0.001 mol %, respectively. With respect to the polymeric compounds (1-1), (1-3), the Mw, Mw/Mn and the copolymer compositional ratio were the same as those of the polymeric compound (1-2).

Production Examples 4 to 12

Production of Polymeric Compounds (2-1) to (4-3)

Polymeric compounds (2-1) to (2-3), (3-1) to (3-3) and (4-1) to (4-3) were produced in the same manner as the polymeric compounds (1-1) to (1-3), except that the following monomers derived the structural units constituting each polymeric compound were used with a predetermined molar ratio. The amount of triethylamine (basic compound) based on the compound (2) or (7) was 0.31 mol % for (2-1), (3-1) and (4-1), 0.25 mol % for (2-2), (3-2) and (4-2), and 0.001 mol % for (2-3), (3-3) and (4-3).

The monomers used for polymeric compounds (2-1) to (4-3), and the Mw, Mw/Mn and copolymer compositional ratio of the polymeric compounds (2-1) to (4-3) are shown below.

[Chemical Formula 51]

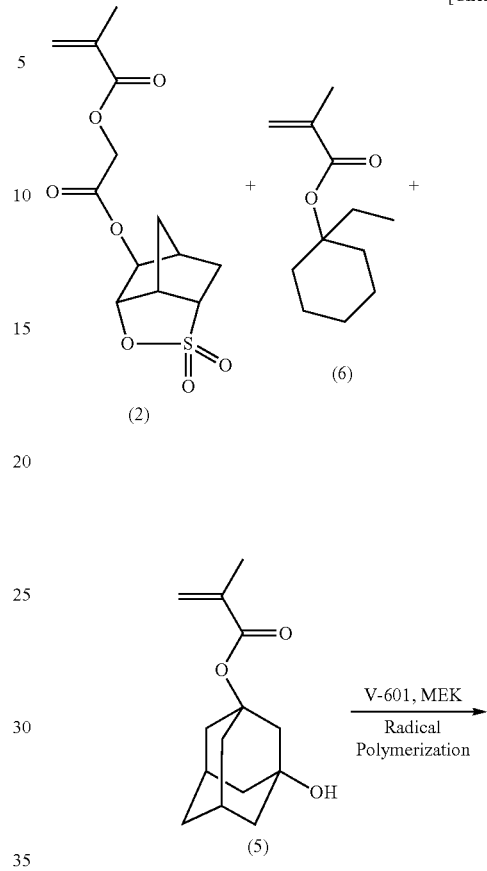

Polymeric compounds (2-1)-(2-3)

[Mw = 7,300, Mw/Mn = 1.70, l/m/n = 39/37/24]

[Chemical Formula 52]

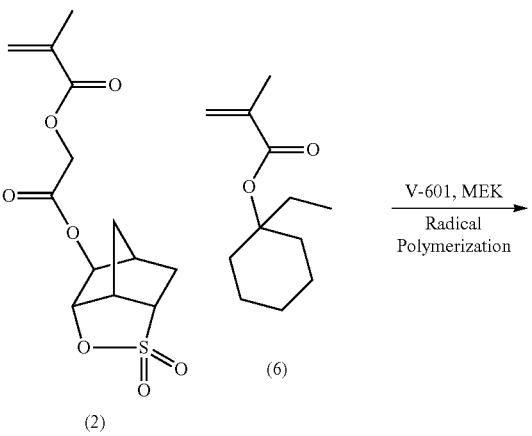

Polymeric compounds (3-1)-(3-3)

[Mw = 7,000, Mw/Mn = 1.63, l/m = 50/50]

[Chemical Formula 53]

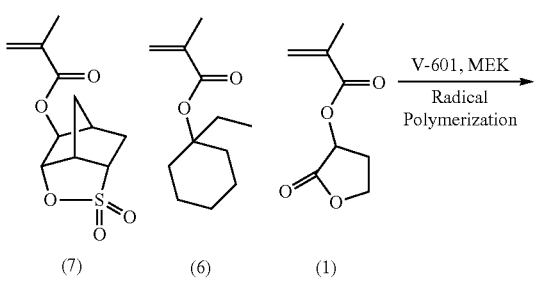

Polymeric compounds (4-1)-(4-3)

[Mw = 7,000, Mw/Mn = 1.63, l/m/n = 40/38/22]

Production Examples 13 to 15

Production of Polymeric Compounds (5-1) to (5-3)

Polymeric compounds (5-1) to (5-3) were produced in the same manner as the polymeric compounds (4-1) to (4-3), except that aniline was used as the basic compound. The amount of aniline (basic compound) based on the compound (7) was 0.31 mol % for (5-1), 0.25 mol % for (5-2), and 0.001 mol % for (5-3).

The Mw, Mw/Mn and copolymer compositional ratio of the obtained polymeric compounds (5-1) to (5-3) are shown below.

[Chemical Formula 54]

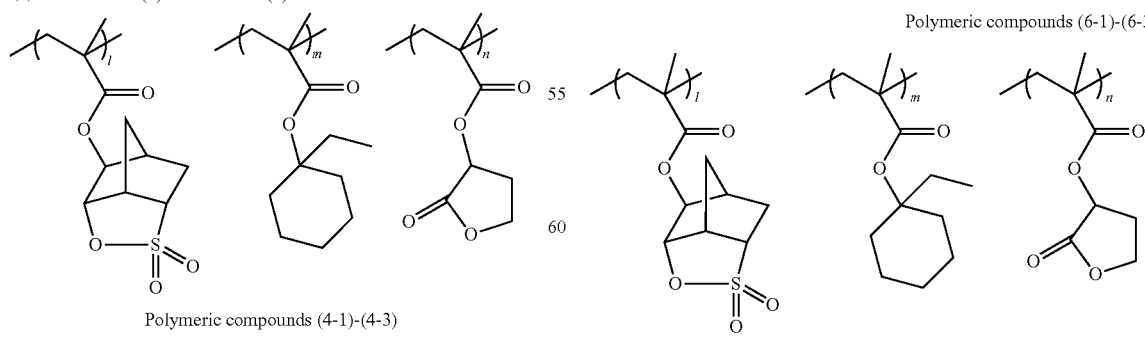

Polymeric compounds (5-1)-(5-3)

[Mw = 7,000, Mw/Mn = 1.63, l/m/n = 40/38/22]

Production Examples 16 to 18

Production of Polymeric Compounds (6-1) to (6-3)

Polymeric compounds (6-1) to (6-3) were produced in the same manner as the polymeric compounds (4-1) to (4-3), except that pyridine was used as the basic compound. The amount of pyridine (basic compound) based on the compound (7) was 0.31 mol % for (6-1), 0.25 mol % for (6-2), and 0.001 mol % for (6-3).

The Mw, Mw/Mn and copolymer compositional ratio of the obtained polymeric compounds (6-1) to (6-3) are shown below.

[Chemical Formula 55]

Polymeric compounds (6-1)-(6-3)

[Mw = 7,000, Mw/Mn = 1.63, l/m/n = 40/38/22]

Comparative Production Examples 1 to 6

Production of Polymeric Compounds (1-0) to (6-0)

Polymeric compounds (1-0) to (6-0) were produced in the same manner as the polymeric compounds (1-1) to (6-1), except that the amount of the basic compound used, based on the amount of the compound (2) or (7) was changed to 5.0 mol %. The structures, Mw, Mw/Mn and copolymer compositional ratio were the same as those of the polymeric compounds (1-1) to (6-1), respectively.

Comparative Production Examples 7 to 14

Production of Polymeric compounds (1-4) to (6-4)

Polymeric compounds (1-4) to (6-4) were produced in the same manner as the polymeric compounds (1-1) to (6-1), except that no basic compound was used. The structures, Mw, Mw/Mn and copolymer compositional ratio were the same as those of the polymeric compounds (1-1) to (6-1), respectively.

Examples 1 to 18, Comparative Examples 1 to 12

The following components (A) to (S) were mixed together and dissolved to obtain positive resist compositions. The values in brackets [ ] indicate the amount of the component added.

Component (A): Polymeric compound shown in Table 1 [100 parts by weight]

Component (B): compound (B)-1 shown below [10 parts by weight]

Component (D): tri-n-pentylamine (0.1 part by weight)

Component (F): polymeric compound (F)-1 shown below [Mw=26,000, Mw/Mn=1.50, l/m=77/23 (copolymer compositional ratio)] (3 parts by weight)

A mixed solvent containing γ-butyrolactone (25 parts by weight) and PGMEA/PGME=1620/1080 (weight ratio) (1,700 parts by weight)

[Chemical Formula 56]

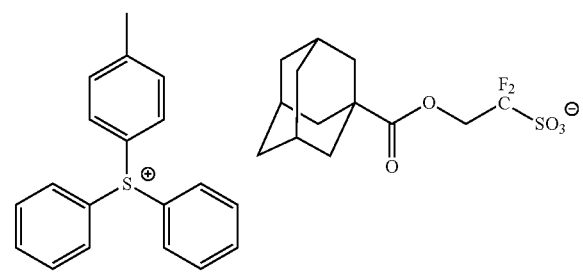

(B)-1

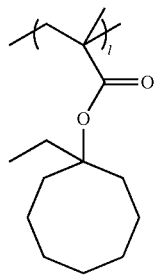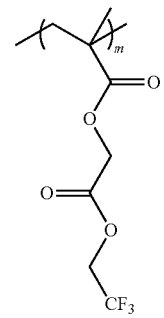

(F)-1

TABLE 1

| | Polymeric compound | Basic compound | Amount of basic compound (mol %) | MEF | LWR (nm) | Number of defects |
|---|---|---|---|---|---|---|
| Comp. Ex. 1 | 1-0 | Triethylamine | 5.0 | 4.5 | 6.0 | 36 |
| Ex. 1 | 1-1 | | 0.31 | 4.0 | 5.6 | 24 |
| Ex. 2 | 1-2 | | 0.025 | 3.5 | 5.1 | 19 |
| Ex. 3 | 1-3 | | 0.001 | 3.7 | 5.4 | 24 |
| Comp. Ex. 2 | 1-4 | — | — | 4.4 | 6.0 | 35 |
| Comp. Ex. 3 | 2-0 | Triethylamine | 5.0 | 4.6 | 6.0 | 44 |
| Ex. 4 | 2-1 | | 0.31 | 4.1 | 5.6 | 16 |
| Ex. 5 | 2-2 | | 0.025 | 3.7 | 5.1 | 21 |
| Ex. 6 | 2-3 | | 0.001 | 3.8 | 5.3 | 29 |
| Comp. Ex. 4 | 2-4 | — | — | 4.5 | 6.1 | 39 |
| Comp. Ex. 5 | 3-0 | Triethylamine | 5.0 | 4.8 | 6.1 | 54 |
| Ex. 7 | 3-1 | | 0.31 | 4.3 | 5.5 | 12 |
| Ex. 8 | 3-2 | | 0.025 | 4.0 | 5.3 | 22 |
| Ex. 9 | 3-3 | | 0.001 | 4.2 | 5.7 | 26 |
| Comp. Ex. 6 | 3-4 | — | — | 4.7 | 6.2 | 58 |
| Comp. Ex. 7 | 4-0 | Triethylamine | 5.0 | 4.5 | 6.1 | 37 |
| Ex. 10 | 4-1 | | 0.31 | 4.1 | 5.4 | 23 |
| Ex. 11 | 4-2 | | 0.025 | 3.8 | 5.3 | 18 |
| Ex. 12 | 4-3 | | 0.001 | 4.0 | 5.6 | 27 |
| Comp. Ex. 8 | 4-4 | — | — | 4.4 | 6.2 | 38 |
| Comp. Ex. 9 | 5-0 | Aniline | 5.0 | 4.4 | 6.1 | 44 |
| Ex. 13 | 5-1 | | 0.31 | 4.0 | 5.7 | 29 |
| Ex. 14 | 5-2 | | 0.025 | 4.2 | 5.8 | 26 |
| Ex. 15 | 5-3 | | 0.001 | 4.3 | 6.0 | 34 |
| Comp. Ex. 10 | 5-4 | — | — | 4.4 | 6.2 | 38 |
| Comp. Ex. 11 | 6-0 | Pyridine | 5.0 | 4.2 | 6.1 | 45 |
| Ex. 16 | 6-1 | | 0.31 | 3.9 | 5.6 | 32 |
| Ex. 17 | 6-2 | | 0.025 | 4.1 | 5.7 | 28 |
| Ex. 18 | 6-3 | | 0.001 | 4.2 | 5.9 | 30 |
| Comp. Ex. 12 | 6-4 | — | — | 4.4 | 6.2 | 38 |

[Formation of Resist Pattern]

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Then, the resist composition of each example was applied to the organic anti-reflection film using a spinner, and was then prebaked (PAB) on a hotplate at 100° C. for 60 seconds and dried, thereby forming a resist film having a film thickness of 80 nm.

Subsequently, the resist film was selectively irradiated with an ArF excimer laser (193 nm) through a mask, using an ArF immersion exposure apparatus NSR-S609B (manufactured by Nikon Corporation, NA (numerical aperture)=1.07, Annular).

Next, a PEB treatment was conducted at 95° C. for 60 seconds, followed by alkali development for 10 seconds at 23° C. in a 2.38% by weight aqueous tetramethylammonium hydroxide (TMAH) solution (product name: NMD-3; manufactured by Tokyo Ohka Kogyo Co., Ltd.). Then, the resist was washed for 15 seconds with pure water, followed by drying by shaking.

As a result, in each of the examples, a line and space pattern (LS pattern) having a line width of 50 nm and a pitch of 100 nm was formed.

[Evaluation of Mask Error Factor (MEF)]

In the same manner as described above, with the above Eop with which an LS pattern having a line width of 50 nm was formed, LS patterns were formed using a mask pattern targeting a line width of 50 nm and a pitch of 100 nm, and a mask pattern targeting a line width of 55 nm and a pitch of 100 nm, and the MEF value was calculated by the following formula. The results are shown in Table 1.

$$MEF = |CD55 - CD50|/|MD55 - MD50|$$

In the formula, CD50 and CD55 represent the respective line widths (nm) of the actual LS patterns respectively formed using the mask pattern targeting a line width of 50 nm and the mask pattern targeting a line width of 55 nm. MD50 and MD55 represent the respective target line widths (nm), meaning MD50=50, and MD55=55.

A MEF value closer to 1 indicates that a resist pattern faithful to the mask pattern was formed.

[Evaluation of Line Width Roughness (LWR)]

With respect to each of the LS patterns formed with the above optimum exposure dose Eop and having a line width of 50 nm and a pitch of 100 nm, the line width at 400 points in the lengthwise direction of the space were measured using a measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR. The results are shown in Table 1. The smaller this 3s value is, the lower the level of roughness of the line width, indicating that a LS pattern with a uniform width was obtained.

[Evaluation of Defect]

With respect to the thus obtained LS pattern having a line width of 50 nm, the contacting of the lines after developing (bridge) was observed using a surface defect observing apparatus (product name: KLA2371; manufactured by KLA-Tencor Corporation)

The number of bridges per one silicon wafer observed are indicated in Table 1.

From the results shown in Table 1, it was confirmed that the resist compositions of Examples 1 to 18 using the polymeric compounds obtained in Production Examples 1 to 18 according to the method of the present invention exhibited excellent lithography properties such as MEF and LWR, and defects could be reduced, as compared to the resist compositions of Comparative Examples 1 to 12.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a polymeric compound, comprising:
copolymerizing a monomer containing an —$SO_2$— containing cyclic group with a monomer containing an acid decomposable group which exhibits increased polarity by the action of acid, thereby obtaining the polymeric compound, provided that the polymeric compound comprises no structural unit derived from a monomer that generates acid upon exposure,
wherein the copolymerizing is conducted in the presence of 0.001 to 1.0 mol % of a basic compound, based on the monomer containing an —$SO_2$— containing cyclic group, and
the basic compound is an amine in which at least one hydrogen atom of $NH_3$ has been substituted with a chain alkyl group or hydroxyalkyl group of no more than 12 carbon atoms.

2. The method according to claim 1, wherein the monomer containing an —$SO_2$— containing cyclic group is represented by general formula (I) shown below:

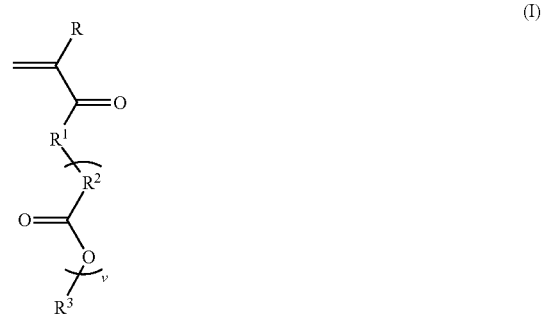

wherein R represents a hydrogen atom, an alkyl group of 1 to 5 carbon atoms or a halogenated alkyl group of 1 to 5 carbon atoms; $R^1$ represents —O— or —NH—; $R^2$ represents a divalent linking group; $R^3$ represents an —$SO_2$— containing cyclic group; and v represents 0 or 1.

3. The method according to Claim 2, wherein $R^3$ is represented by general formula (3-1) shown below:

wherein A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

* * * * *